United States Patent
Shin et al.

(10) Patent No.: US 8,624,625 B2
(45) Date of Patent: Jan. 7, 2014

(54) HIGH DEFINITION MULTIMEDIA INTERFACE (HDMI) APPARATUS INCLUDING TERMINATION CIRCUIT

(75) Inventors: Jong-Shin Shin, Yongin-si (KR); Chi-Won Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/440,457

(22) Filed: Apr. 5, 2012

(65) Prior Publication Data

US 2012/0262200 A1 Oct. 18, 2012

(30) Foreign Application Priority Data

Apr. 12, 2011 (KR) .................. 10-2011-0033694

(51) Int. Cl.
*H03K 17/16* (2006.01)
*H04B 3/00* (2006.01)

(52) U.S. Cl.
USPC ............... 326/30; 326/86; 375/257; 375/219; 375/295

(58) Field of Classification Search
USPC ............ 326/21, 30, 83, 86, 87; 327/108, 179, 327/530, 559; 375/219, 257, 295
See application file for complete search history.

(56) References Cited

U.S. PATENT DOCUMENTS

| | | | |
|---|---|---|---|
| 6,043,562 A * | 3/2000 | Keeth | 257/776 |
| 6,114,898 A | 9/2000 | Okayasu | |
| 6,356,141 B1 * | 3/2002 | Yamauchi | 327/543 |
| 6,898,102 B2 * | 5/2005 | Keeth | 365/63 |
| 7,649,409 B1 * | 1/2010 | Koh et al. | 327/559 |
| 7,679,395 B1 * | 3/2010 | Yang et al. | 326/27 |
| 7,859,298 B1 * | 12/2010 | Swartz et al. | 326/30 |
| 7,861,277 B2 * | 12/2010 | Keady et al. | 725/127 |
| 8,457,242 B2 * | 6/2013 | Kim | 375/295 |
| 2008/0001668 A1 | 1/2008 | Tsujigawa | |
| 2008/0116935 A1 * | 5/2008 | Nair | 326/83 |
| 2008/0116943 A1 * | 5/2008 | Nair | 327/108 |
| 2011/0096848 A1 * | 4/2011 | Lam et al. | 375/257 |

* cited by examiner

*Primary Examiner* — Vibol Tan
(74) *Attorney, Agent, or Firm* — F. Chau & Associates, LLC

(57) ABSTRACT

A termination circuit for a HDMI transmitter includes a bias unit and a termination resistor unit connected in parallel between a positive transmission pin and a negative transmission pin. The bias unit generates a bias voltage by selecting the higher voltage among a first voltage received through the positive transmission pin and a second voltage received through the negative transmission pin. The termination resistor unit is formed on a well region biased by the bias voltage, and conditionally provides a termination resistance between the positive transmission pin and the negative transmission pin in response to a termination resistor control signal. The termination circuit conditionally provides a termination resistance without a leakage current. The termination resistance may be varied by using an n-bit control code.

28 Claims, 12 Drawing Sheets

HIGH DEFINITION MULTIMEDIA INTERFACE (HDMI) APPARATUS INCLUDING TERMINATION CIRCUIT

CROSS-REFERENCE TO RELATED APPLICATION(S)

This application claims priority under 35 USC §119 to Korean Patent Application No. 10-2011-0033694, filed on Apr. 12, 2011 in the Korean Intellectual Property Office (KIPO), the contents of which are herein incorporated by reference in their entirety.

TECHNICAL FIELD

Exemplary embodiments relate to a termination circuit, and more particularly to a termination circuit for a HDMI (High Definition Multimedia Interface) transmitter, a HDMI transmitter including the termination circuit, and a multimedia source apparatus including the HDMI transmitter.

DISCUSSION OF THE RELATED ART

HDMI (High-Definition Multimedia Interface) is a compact audio/video interface for transmitting uncompressed digital data. It is a digital alternative to consumer analog standards, such as radio frequency (RF) coaxial cable, composite video, S-Video, SCART, component video, D-Terminal, or VGA (also called D-sub or DE-15F). HDMI connects digital audio/video sources (such as set-top boxes, DVD players, Blu-ray Disc players, personal computers (PCs), video game consoles, AV receivers, tablet computers, and mobile phones) to compatible digital audio devices, computer monitors, video projectors, and digital televisions. HDMI, is a digital audio, video and control signal format defined by 7 of the largest consumer electronics manufacturers. HDMI 1.0 was released Dec. 9, 2002 and is a single-cable digital audio/video connector interface with a maximum TMDS bandwidth of 4.9 Gbit/s and the Dual-Link could handle about 10 Gbps. HDMI 1.0 supports up to 3.96 Gbit/s of video bandwidth (1080 p/60 Hz or UXGA) and 8 channel LPCM/192 kHz/24-bit audio. HDMI 1.3 was released Jun. 22, 2006 and increased the single-link bandwidth to 340 MHz (10.2 Gbit/s). Thus, HDMI 1.3 doubles the maximum data rate from 5 to 10 Gbps, and the color depth is increased from 24 bit to 30, 36 or 48 bit.

Data rate refers to total number of digital bits in a second for a given signal. The higher resolution, refresh rate, color depth, the higher the data rate. For cables, data rate is critical because a cable is a passive device that does not know the signal content. When the cable length increases, the image quality is perceived to be perfect by human eyes until a length corresponding to too much noise. After that length, the image is either not viewable or disappears all together. According to the HDMI standard, a HDMI transmitter transmits data using a driver having the open drain form. Thus, the HDMI transmitter operates using a voltage of about 3.3V provided by a HDMI receiver. In general, a driver having the open drain form has a very large output resistance on the order of kilo ohms or mega ohms. Therefore, as the data transmission speed increases, a signal reflection on the output resistance of an open drain driver of the HDMI transmitter increases such that signal integrity is degraded.

The longer cables and un-known devices introduce the potential for communication error. The error rate overwhelms the built-in error correction technology used in digital transmission. The symptoms of communication error can range from no picture, jumping picture, snowy picture, wrong resolution and no audio. The display can tolerate a certain amount of error bits per second; the picture would still be perfect as long as the error rate is below that threshold. Once the error rate through the cable exceeds the capability of the display, signal recovery may fail altogether. Better termination of signal reflection allows for the use of less expensive and/or longer HDMI cables.

SUMMARY

Some aspects of the invention provide a termination circuit capable of conditionally providing a termination resistance.

Some aspects of the invention provide a HDMI transmitter including the termination circuit.

Some aspects of the invention provide a multimedia source apparatus including the HDMI transmitter.

In various to exemplary embodiments, a termination circuit includes a bias unit and a termination resistor unit connected between a positive transmission pin and a negative transmission pin. The bias unit generates a bias voltage by selecting the higher voltage among a first voltage received through the positive transmission pin and a second voltage received through the negative transmission pin. The termination resistor unit is formed on a well region biased by the bias voltage, and conditionally provides a termination resistor (e.g., a fixed or variable predetermined termination resistance) between the positive transmission pin and the negative transmission pin in response to a termination resistor control signal.

The bias unit and the termination resistor unit may be connected in parallel between the positive transmission pin and the negative transmission pin.

The bias unit may include two PMOS transistors, where gates and drains of the two PMOS transistors are cross-coupled.

In some exemplary embodiments, the bias unit comprises a first PMOS transistor formed on an n-type well region, and a second PMOS transistor formed on an n-type well region. The first PMOS transistor includes a gate, a drain connected to the positive transmission pin, and a source connected to a first node. The second PMOS transistor includes a gate connected to the drain of the first PMOS transistor, a source connected to the first node, and a drain connected to the negative transmission pin and the gate of the first PMOS transistor. The n-type well region may be connected to the first node, and the bias unit may provide the bias voltage at the first node.

The bias unit may further comprise a first protection resistor connected between the positive transmission pin and the drain of the first PMOS transistor and a second protection resistor connected between the negative transmission pin and the drain of the second PMOS transistor.

The termination resistor unit may comprise a PMOS transistor formed on the well region and having its gate configured to receive the termination resistor control signal, a first termination resistor connected between the positive transmission pin and the source of the PMOS transistor, and a second termination resistor connected between the negative transmission pin and the drain of the PMOS transistor.

The termination resistor unit may comprise a plurality of termination resistor blocks connected in parallel between the positive transmission pin and the negative transmission pin. Each of the plurality of the termination resistor blocks may comprise a PMOS transistor formed on the well region and having its gate configured to receive the termination resistor control signal, a first termination resistor connected between the positive transmission pin and the source of the PMOS transistor, and a second termination resistor connected between the negative transmission pin and the drain of the PMOS transistor.

The termination resistor unit may comprise a first PMOS transistor formed on the well region and including a drain, a source, and having its gate configured to receive the termination resistor control signal, a second PMOS transistor formed on the well region and including a drain, a source connected to the drain of the first PMOS transistor, and having its gate configured to receive the termination resistor control signal, a first termination resistor connected between the positive transmission pin and the source of the first PMOS transistor, and a second termination resistor connected between the negative transmission pin and the drain of the second PMOS transistor.

The termination resistor unit may comprise a plurality of termination resistor blocks connected in parallel between the positive transmission pin and the negative transmission pin. Each of the plurality of the termination resistor blocks may comprise a first PMOS transistor formed on the well region and including a drain, a source, and having its gate receiving the termination resistor control signal, a second PMOS transistor formed on the well region and including a drain, having its source connected to the drain of the first PMOS transistor, and having its gate receiving the termination resistor control signal, a first termination resistor connected between the positive transmission pin and the source of the first PMOS transistor, and a second termination resistor connected between the negative transmission pin and the drain of the second PMOS transistor.

The termination circuit may further comprise a control unit configured to convert a voltage level of an ON/OFF control signal to generate the termination resistor control signal.

The bias unit, the termination resistor unit, and the control unit may operate using only the first voltage and the second voltage.

Each of the bias unit, the termination resistor unit, and the control unit may include a MOS transistor having a voltage tolerance of about 1.8V or less.

The termination resistor control signal generated by the control unit may have a voltage equal to or higher than 1.5V when the termination resistor control signal is at a logic low level.

The control unit may convert the voltage level of the ON/OFF control signal using the first voltage and the second voltage.

The control unit may comprise a common voltage generation unit configured to generate a common voltage using the first voltage and the second voltage, where the common voltage has a voltage between the first voltage and the second voltage, a voltage drop unit configured to generate an inner control voltage by dropping a voltage of the common voltage, and a voltage conversion unit configured to generate the termination resistor control signal in response to the ON/OFF control signal using the common voltage and the inner control voltage, where the termination resistor control signal has a voltage substantially equal to the common voltage when the ON/OFF control signal is at a logic low level and has a voltage lower than the common voltage when the ON/OFF control signal is at a logic high level.

The common voltage generation unit may comprise a first resistor connected between the positive transmission pin and a second node, and a second resistor connected between the negative transmission pin and the second node, where the common voltage generation unit provides the common voltage at the second node.

The voltage drop unit may comprise a third resistor connected between the second node and a third node, and a fourth resistor connected between the third node and a ground voltage, where the voltage drop unit provides the inner control voltage at the third node.

The voltage conversion unit may comprise a fifth resistor connected between the second node and a fourth node, a sixth resistor, where a first end of the sixth resistor is connected to the fourth node, a first NMOS transistor including a source, having its gate configured to receive the inner control voltage, and having its drain connected to a second end of the sixth resistor, and a second NMOS transistor having its source connected to the ground voltage, having its gate receiving the ON/OFF control signal, and having its drain connected to the source of the first NMOS transistor, where the voltage conversion unit provides the termination resistor control signal at the fourth node.

The control unit may convert the voltage level of the ON/OFF control signal using the bias voltage.

The control unit may comprise a voltage drop unit (e.g. a voltage divider unit) configured to generate an inner control voltage by dropping (e.g., dividing) a voltage of the bias voltage, and a voltage conversion unit configured to generate the termination resistor control signal using the bias voltage and the inner control voltage, where the termination resistor control signal has a voltage substantially equal to the bias voltage when the ON/OFF control signal is at a logic low level and has a voltage lower than the bias voltage when the ON/OFF control signal is at a logic high level.

In various exemplary embodiments, a HDMI transmitter includes a first NMOS transistor, a second NMOS transistor, a current source, and a termination circuit. The first NMOS transistor includes a source, and has its drain connected to a negative transmission pin, and has its gate receiving a data signal. The second NMOS transistor has its source connected to the source of the first NMOS transistor, its drain connected to a positive transmission pin, and its gate configured to receive an inverted data signal, where the inverted data signal is an inverted version of the data signal. The current source is connected between the source of the second NMOS transistor and a ground voltage. The termination circuit conditionally provides a termination resistance between the positive transmission pin and the negative transmission pin in response to an ON/OFF control signal, where a part of the termination circuit is formed on a well region. The well region is biased by a bias voltage higher than the lowest voltage among a first voltage received through the positive transmission pin and a second voltage received through the negative transmission pin. Preferably, the well region is biased by the highest voltage among a first voltage received through the positive transmission pin and a second voltage received through the negative transmission pin.

The termination circuit may comprise a bias unit connected between the positive transmission pin and the negative transmission pin and configured to generate a bias voltage by selecting the higher (i.e., highest) voltage among the first voltage and the second voltage, a control unit configured to convert a voltage level of the ON/OFF control signal to generate a termination resistor control signal, and a termination resistor unit formed on the semiconductor well region biased by the bias voltage and conditionally providing the termination resistance between the positive transmission pin and the negative transmission pin in response to the termination resistor control signal.

In various exemplary embodiments, a multimedia source apparatus includes a storage device, a HDMI transmitter, and a processor. The storage device stores multimedia data. The HDMI transmitter transmits the multimedia data through a positive transmission pin and a negative transmission pin, and conditionally provides a termination resistor between the positive transmission pin and the negative transmission pin in response to an ON/OFF control signal. The processor provides the multimedia data stored in the storage device and the ON/OFF control signal to the HDMI transmitter. The HDMI transmitter comprises a first NMOS transistor including a source, having its drain connected to the negative transmission pin, and having its gate configured to receive a data signal, a second NMOS transistor having its source connected to the source of the first NMOS transistor, having its drain connected to the positive transmission pin, and having its gate configured to receive an inverted data signal, where the inverted data signal is an inverted version of the data signal, a current source connected between the source of the second NMOS transistor and a ground voltage, and a termination circuit configured to conditionally provide the termination resistor between the positive transmission pin and the negative transmission pin in response to the ON/OFF control signal, where a part of the termination circuit is formed on a semiconductor well region biased by the higher voltage among a first voltage received through the positive transmission pin and a second voltage received through the negative transmission pin.

Various exemplary embodiments will be described more fully with reference to the accompanying drawings, in which some exemplary embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

BRIEF DESCRIPTION OF THE DRAWINGS

Illustrative, non-limiting exemplary embodiments will be more clearly understood from the following detailed description in conjunction with the accompanying drawings, in which.

DETAILED DESCRIPTION OF THE EXEMPLARY EMBODIMENTS

Figure 1:
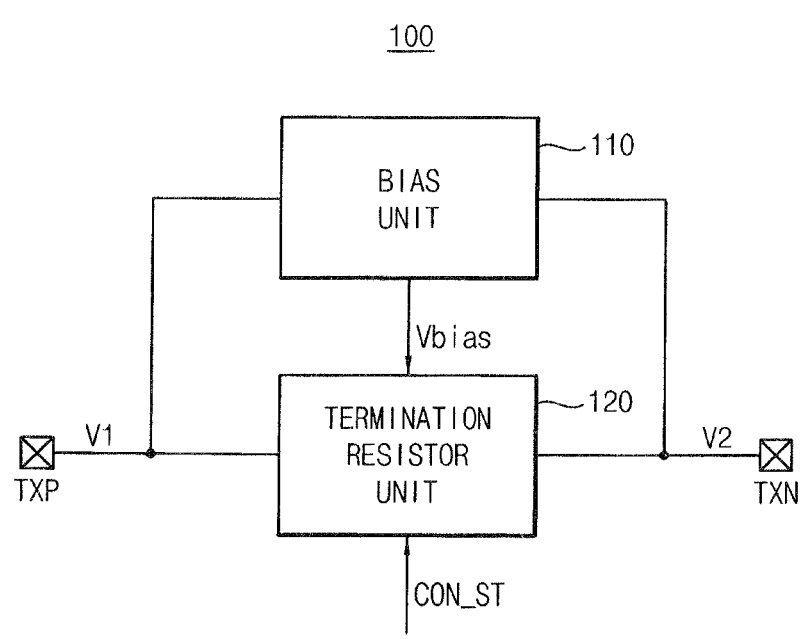
FIG. 1 is a block diagram of a termination circuit according to an exemplary embodiment.

FIG. 1 is a block diagram of a termination circuit according to an exemplary embodiment.

The termination circuit 100 of FIG. 1 may be used for a HDMI (High Definition Multimedia Interface) transmitter.

Referring to FIG. 1, the termination circuit 100 includes a bias unit 110 and a termination resistor unit 120. The bias unit 110 is connected between a positive transmission pin TXP and a negative transmission pin TXN. The bias unit 110 receives a first voltage V1 through the positive transmission pin TXP and a second voltage V2 through the negative transmission pin TXN. The bias unit 110 generates a bias voltage Vbias by selecting the higher voltage among the first voltage V1 and the second voltage V2. Thus, the bias unit 110 selects the higher (i.e., highest) voltage selected from among the first voltage V1 and the second voltage V2 and outputs the selected (higher) voltage as the bias voltage Vbias.

The termination resistor unit 120 includes a well region of a semiconductor material biased by the bias voltage Vbias. The termination resistor unit 120 is formed on the well region. The termination resistor unit 120 conditionally provides a termination resistance between the positive transmission pin TXP and the negative transmission pin TXN in response to a termination resistor control signal CON_ST.

The bias unit 110 and the termination resistor unit 120 are preferably both connected in parallel between the positive transmission pin TXP and the negative transmission pin TXN.

The bias unit 110 and the termination resistor unit 120 need not include any power source and may operate using only the first voltage V1 and the second voltage V2 as its power source.

Multimedia data may be transmitted through the positive transmission pin TXP and the negative transmission pin TXN in the form of a differential signal.

The termination circuit 100 may be operated to meet the requirements of each of the current and future HDMI standards. Because, as data transmission speed increases, a signal reflection on the output resistance of an open drain driver of the HDMI transmitter increases, the HDMI standard allows connection of a termination resistor between the positive transmission pin and the negative transmission pin when the data transmission speed is greater than 1.65 Gbps (Giga bit per second).

The termination circuit 100 of FIG. 1 according to exemplary embodiments may be used in a HDMI transmitter and conditionally provides a termination resistor (i.e., a termination resistance) between the positive transmission pin TXP and the negative transmission pin TXN in response to the termination resistor control signal CON_ST.

Figure 2:
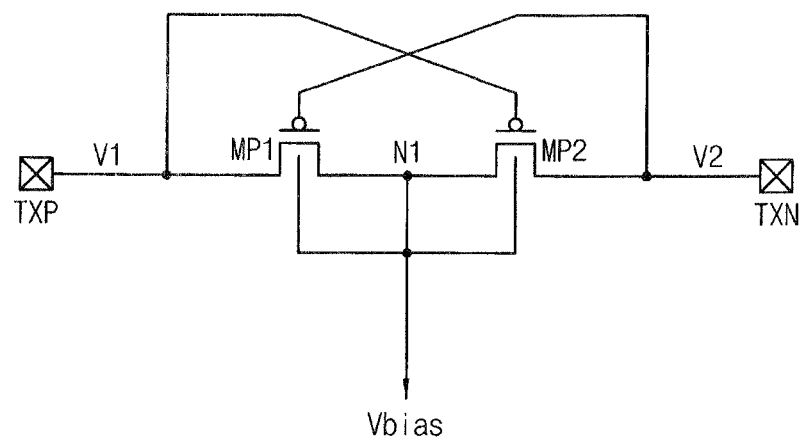
FIG. 2 is a circuit diagram of an example of a bias unit included in the termination circuit of FIG. 1.

FIG. 2 is a circuit diagram of an example 110a of a bias unit 110 included in the termination circuit 100 of FIG. 1.

Referring to FIG. 2, the bias unit 110a may include a first PMOS (P-type Metal Oxide Semiconductor) transistor MP1 and a second PMOS transistor MP2. Gates and drains of the first PMOS transistor MP1 and the second PMOS transistor MP2 may be cross-coupled. Thus, the higher voltage among V1 of the positive transmission pin TXP and V2 of the negative transmission pin TXN (relative to node N1) will be selected and output at node N1 as Vbias.

Thus, the first PMOS transistor MP1 may have its gate connected to the drain of the second PMOS transistor MP2, its drain connected to the positive transmission pin TXP, and its source connected to a first node N1. The second PMOS transistor MP2 may have its gate connected to the drain of the first PMOS transistor MP1, its source connected to the first node N1, and its drain connected to the negative transmission pin TXN and the gate of the first PMOS transistor MP1. Thus the bias unit 110a provides the selected bias voltage Vbias at the first node N1.

The first PMOS transistor MP1 and the second PMOS transistor MP2 may be formed on the same N-type well region of a semiconductor substrate. The N-type well region may be coupled to the first node N1. Therefore, the N-type well region on which the first PMOS transistor MP1 and the second PMOS transistor MP2 are formed may be biased by the bias voltage Vbias outputted at the first node N1.

Hereinafter, the operation of the bias unit 110a will be described with reference to FIG. 2.

According to the HDMI standard, a HDMI transmitter operates using a voltage of about 3.3V received from a HDMI receiver through the positive transmission pin TXP and the negative transmission pin TXN. During a data transmission, the first voltage V1 of the positive transmission pin TXP and the second voltage V2 of the negative transmission pin TXN may be about 3.3V or about 2.7V, respectively. For example, when the HDMI transmitter transmits a data signal having a logic high level, the first voltage V1 of the positive transmission pin TXP may be about 3.3V and the second voltage V2 of the negative transmission pin TXN may be about 2.7V. Alternatively, when the HDMI transmitter transmits a data signal having a logic low level, the first voltage V1 of the positive transmission pin TXP may be about 2.7V and the second voltage V2 of the negative transmission pin TXN may be about 3.3V.

Referring to FIG. 2, when the first voltage V1 of the positive transmission pin TXP is about 3.3V and the second voltage V2 of the negative transmission pin TXN is about 2.7V, thus, the first voltage V1 is higher than the second voltage V2, the first PMOS transistor MP1 may be turned ON and the second PMOS transistor MP2 may be turned OFF. Therefore, charges may be transferred to the first node N1 through the positive transmission pin TXP and the first PMOS transistor MP1, and the charges may be accumulated in the N-type well region, on which the first PMOS transistor MP1 and the second PMOS transistor MP2 are formed, since the N-type well region is connected to the first node N1. As such, the N-type well region may be biased by the first voltage V1 and the bias unit 110a may output the first voltage V1 at the first node N1 as the bias voltage Vbias.

Alternatively, when the first voltage V1 of the positive transmission pin TXP is about 2.7V and the second voltage V2 of the negative transmission pin TXN is about 3.3V, thus, the second voltage V2 is higher than the first voltage V1, the first PMOS transistor MP1 may be turned OFF and the second PMOS transistor MP2 may be turned ON. Therefore, charges may be transferred to the first node N1 through the negative transmission pin TXN and the second PMOS transistor MP2, and the charges may be accumulated in the N-type well region, on which the first PMOS transistor MP1 and the second PMOS transistor MP2 are formed, since the N-type well region is connected to the first node N1. As such, the N-type well region may be biased by the second voltage V2 and the bias unit 110a may output the second voltage V2 at the first node N1 as the bias voltage Vbias.

Therefore, the bias unit 110a may selectively output the higher voltage among the first voltage V1 received through the positive transmission pin TXP and the second voltage V2 received through the negative transmission pin TXN as the bias voltage Vbias. In addition, the N-type well region on which the first PMOS transistor MP1 and the second PMOS transistor MP2 are formed may become biased by the higher voltage among the first voltage V1 and the second voltage V2, selected as the bias voltage Vbias.

The sources of the first PMOS transistor MP1 and the second PMOS transistor MP2 include a region doped with P+ impurities, and the higher voltage among the first voltage V1 and the second voltage V2 is applied to the sources of the first PMOS transistor MP1 and the second PMOS transistor MP2. Therefore, if the N-type well region is biased by a voltage lower than the highest voltage among the first voltage V1 and the second voltage V2, a forward voltage may be applied to a diode junction between the sources of the first PMOS transistor MP1 and the second PMOS transistor MP2 and the N-type well region. As such, a leakage current may flow from the sources of the first PMOS transistor MP1 and the second PMOS transistor MP2 to the N-type well region.

However, as described above, the N-type well region is biased by the higher voltage among the first voltage V1 and the second voltage V2, e.g., the bias voltage Vbias. Therefore, the bias unit 110a may prevent the leakage current effectively.

Since the first PMOS transistor MP1 and the second PMOS transistor MP2 are series connected between the positive transmission pin TXP and the negative transmission pin TXN, the gate-source voltage and the gate-drain voltage of the first PMOS transistor MP1 and the second PMOS transistor MP2 are lower than the voltage difference between the positive transmission pin TXP and the negative transmission pin TXN. As described above, since one of the first voltage V1 and the second voltage V2 is about 3.3V and the other of the first voltage V1 and the second voltage V2 is about 2.7V, the voltage difference between the positive transmission pin TXP and the negative transmission pin TXN may be about 0.6V, such that the gate-source voltage and the gate-drain voltage of the first PMOS transistor MP1 and the second PMOS transistor MP2 may be lower than about 0.6V. Therefore, the first PMOS transistor MP1 and the second PMOS transistor MP2 may have a voltage tolerance lower than about 3.3V without degrading reliability of the termination circuit 100. For example, the first PMOS transistor MP1 and the second PMOS transistor MP2 may have a voltage tolerance of about 1.8V or less.

Figure 3:
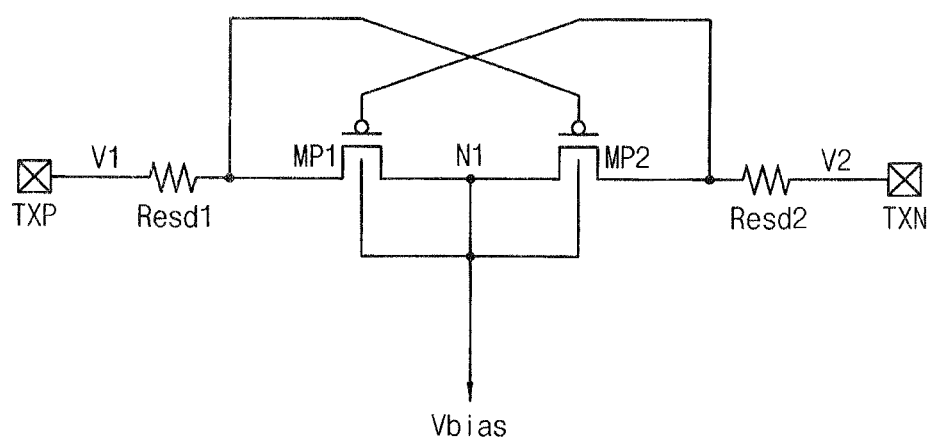
FIG. 3 is a circuit diagram of another example of a bias unit included in the termination circuit of FIG. 1.

FIG. 3 is a circuit diagram of another example of a bias unit included in the termination circuit of FIG. 1.

Referring to FIG. 3, the bias unit 110b includes a first PMOS transistor MP1, a second PMOS transistor MP2, a first protection resistor Resd1 and a second protection resistor Resd2. Gates and drains of the first PMOS transistor MP1 and the second PMOS transistor MP2 are cross-coupled.

Comparing the bias unit 110b to the bias unit 110a of FIG. 2, the bias unit 110b may further include the first protection resistor Resd1 and the second protection resistor Resd2. The first PMOS transistor MP1 and the second PMOS transistor MP2 included in the bias unit 110b may have the same structure and ON/OFF operation as the first PMOS transistor MP1 and the second PMOS transistor MP2 included in the bias unit 110a. The structure and ON/OFF operation of the first PMOS transistor MP1 and the second PMOS transistor MP2 included in the bias unit 110a are described above with reference to FIGS. 1 and 2. Therefore, a redundant detailed description of the first PMOS transistor MP1 and the second PMOS transistor MP2 included in the bias unit 110b will be omitted.

The first protection resistor Resd1 is connected between the positive transmission pin TXP and the drain of the first PMOS transistor MP1. The second protection resistor Resd2 is connected between the negative transmission pin TXN and the drain of the second PMOS transistor MP2.

The first protection resistor Resd1 and the second protection resistor Resd2 may have the same resistance.

The first protection resistor Resd1 may block an electrostatic discharge (ESD) flowing into the first PMOS transistor MP1 through the positive transmission pin TXP, so that the first protection resistor Resd1 may protect the first PMOS transistor MP1. The second protection resistor Resd2 may block an electrostatic discharge (ESD) flowing into the second PMOS transistor MP2 through the negative transmission pin TXN, so that the second protection resistor Resd2 may protect the second PMOS transistor MP2.

As described above, one or the other of the first PMOS transistor MP1 and the second PMOS transistor MP2 will be turned OFF during operation. Therefore, current that flows through the first protection resistor Resd1 and through the second protection resistor Resd2 may be substantially zero.

Figure 4:
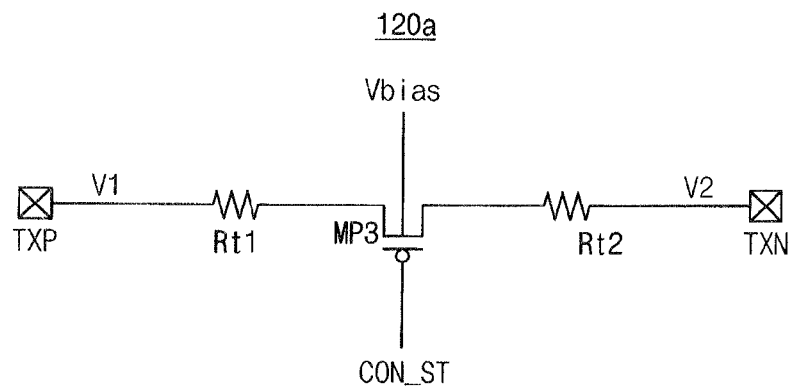
FIGS. 4 to 7 are circuit diagrams of examples of a termination resistor unit included in the termination circuit of FIG. 1.

FIG. 4 is a circuit diagram of an example of a termination resistor unit included in the termination circuit of FIG. 1.

Referring to FIG. 4, the termination resistor unit 120a includes a first termination resistor Rt1, a second termination resistor Rt2 and a third PMOS transistor MP3.

The first termination resistor Rt1 may be connected between the positive transmission pin TXP and the source of the third PMOS transistor MP3.

The second termination resistor Rt2 may be connected between the negative transmission pin TXN and the drain of the third PMOS transistor MP3.

The first termination resistor Rt1 and the second termination resistor Rt2 may have the same resistance. For example, a resistance of each of the first termination resistor Rt1 and the second termination resistor Rt2 may be about 150 ohms.

The third PMOS transistor MP3 may be formed on the semiconductor well region biased by the bias voltage Vbias provided from the bias unit 110. The well region may be N-type well formed of a semiconductor material doped with N-type impurities. The third PMOS transistor MP3 includes its source connected to the first termination resistor Rt1, its drain connected to the second termination resistor Rt2, and its gate configured to receive the termination resistor control signal CON_ST.

The third PMOS transistor MP3 switchably connects the first termination resistor Rt1 and the second termination resistor Rt2 in series between the positive transmission pin TXP and the negative transmission pin TXN in response to a logic (voltage) level of the termination resistor control signal CON_ST. For example, when the termination resistor control signal CON_ST is at a logic high level, the third PMOS transistor MP3 is turned OFF such that the first termination resistor Rt1 and the second termination resistor Rt2 are not connected in series between the positive transmission pin TXP and the negative transmission pin TXN. Alternatively, when the termination resistor control signal CON_ST is at a logic low level, the third PMOS transistor MP3 is turned ON such that the first termination resistor Rt1 and the second termination resistor Rt2 are connected in series between the positive transmission pin TXP and the negative transmission pin TXN.

As described above, the N-type well region on which the third PMOS transistor MP3 is formed is biased by the bias voltage Vbias, and preferably the bias voltage Vbias is the highest voltage among the first voltage V1 and the second voltage V2. Therefore, the N-type well region will be biased by the higher voltage among the first voltage V1 and the second voltage V2. The source and the drain of the third PMOS transistor MP3 may include a semiconductor region doped with P+ type impurities, and a voltage applied between the source and the drain of the third PMOS transistor MP3 may be lower than about 3.3V. Therefore, a forward voltage will not be applied across P-N diode junctions formed between the source of the third PMOS transistor MP3 and the N-type well region and between the drain of the third PMOS transistor MP3 and the N-type well region. As such, the termination resistor unit 120a can effectively prevent a leakage current that conventionally flows from the source of the third PMOS transistor MP3 to the N-type well region and from the drain of the third PMOS transistor MP3 to the N-type well region.

The third PMOS transistor MP3 may have a voltage tolerance of about 1.8V or less. Therefore, since the highest voltage applied to the source or the drain of the third PMOS transistor MP3 may be up to about 3.3V, a voltage of a logic low level of the termination resistor control signal CON_ST, which is applied to the gate of the third PMOS transistor MP3, may be higher than about 1.5V.

Figure 5:
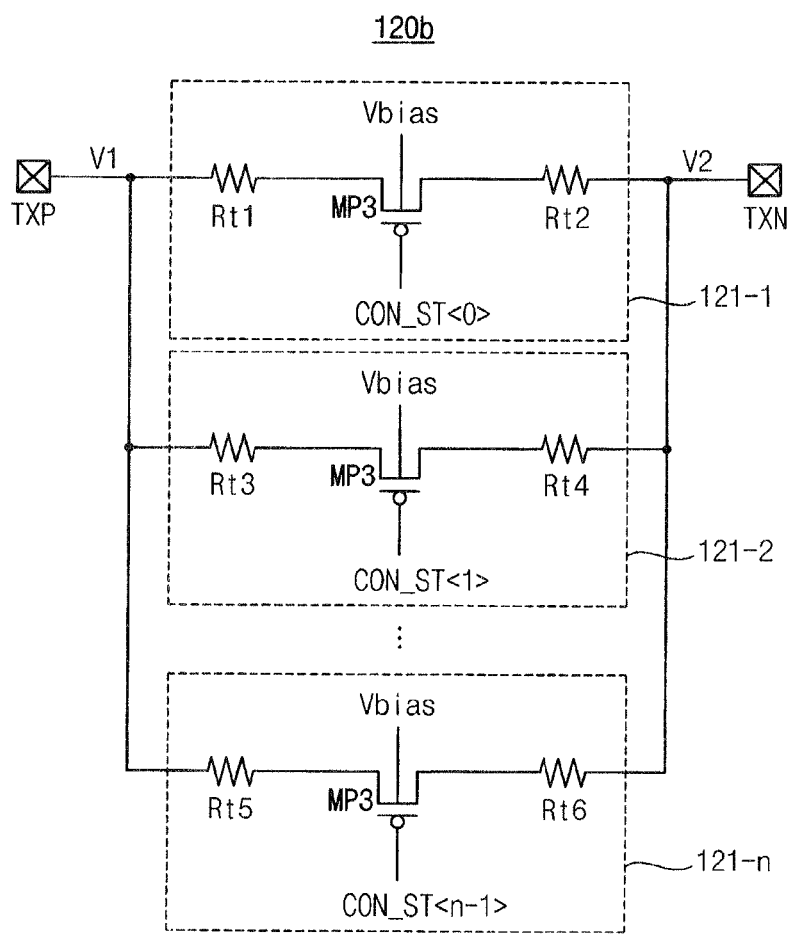

FIG. 5 is a circuit diagram of another example of a termination resistor unit included in the termination circuit of FIG. 1.

Referring to FIG. 5, a termination resistor unit 120b may include a plurality of termination resistor blocks 121-1, 121-2, . . . , 121-n (wherein n is a positive integer) connected in parallel between the positive transmission pin TXP and the negative transmission pin TXN.

The first termination resistor block 121-1 includes a first termination resistor Rt1, a second termination resistor Rt2 and a third PMOS transistor MP3. The second termination resistor block 121-2 includes a third termination resistor Rt2, a fourth termination resistor Rt4 and a third PMOS transistor MP3. Each n-th termination resistor block 121-n may include a fifth termination resistor Rt5, a sixth termination resistor Rt6 and a third PMOS transistor MP3.

Each of the plurality of n termination resistor blocks 121-1, 121-2, . . . , 121-n has the same structure as the termination resistor unit 120a of FIG. 4. Thus, the termination resistor unit 120b of FIG. 5 may include a plurality of the termination resistor units 120a of FIG. 4 connected in parallel between the positive transmission pin TXP and the negative transmission pin TXN. Therefore, a redundant detailed description of each of the plurality of n termination resistor blocks 121-1, 121-2, . . . , 121-n will be omitted.

In some exemplary embodiments, the first to the sixth termination resistors Rt1, Rt2, Rt3, Rt4, Rt5 and Rt6 may have the same resistance. In some other exemplary embodiments, the first to the sixth termination resistors Rt1, Rt2, Rt3, Rt4, Rt5 and Rt6 may have a different resistances.

The termination resistor control signal CON_ST may include n bits, and the third PMOS transistor MP3 included in each of the plurality of termination resistor blocks 121-1, 121-2, . . . , 121-n may be controlled by a corresponding one bit of the n-bit termination resistor control signal CON_ST. For example, the third PMOS transistor MP3 included in the first termination resistor block 121-1 may be controlled by the first bit of the n-bit termination resistor control signal CON_ST<0>, the third PMOS transistor MP3 included in the second termination resistor block 121-2 may be controlled by the second bit of the n-bit termination resistor control signal CON_ST<1>, and the third PMOS transistor MP3 included in the n-th termination resistor block 121-n may be controlled by the n-th bit of the n-bit termination resistor control signal CON_ST<n−1>.

As illustrated in FIG. 5, the termination resistor unit 120b may adjust the total resistance of a conditional termination resistor connected between the positive transmission pin TXP and the negative transmission pin TXN by individually controlling a number of the termination resistor blocks turned ON using the n-bit termination resistor control signal CON_ST. For example, considering a case that the first to the sixth termination resistors Rt1, Rt2, Rt3, Rt4, Rt5 and Rt6 has the same resistance of 150 ohms, the termination resistor unit 120b can provide a maximum total termination resistance of 300 ohm between the positive transmission pin TXP and the negative transmission pin TXN by turning ON only one of the termination resistor blocks, and can provide a total termination resistance of 150 ohms between the positive transmission pin TXP and the negative transmission pin TXN by turning ON two termination resistor blocks.

Figure 6:
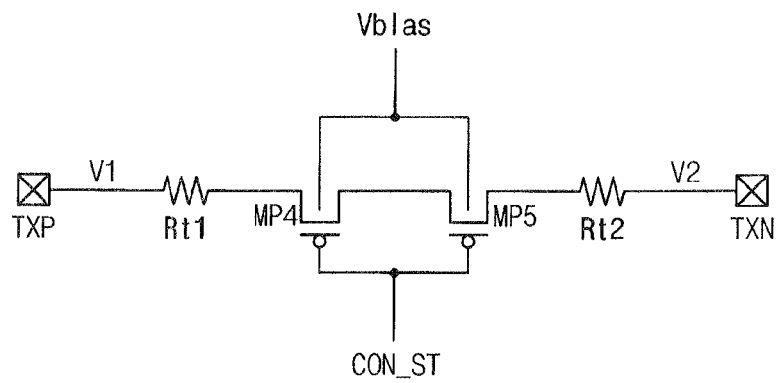

FIG. 6 is a circuit diagram of still another example of a termination resistor unit included in the termination circuit of FIG. 1.

Referring to FIG. 6, a termination resistor unit 120c may include a first termination resistor Rt1, a second termination resistor Rt2, a fourth PMOS transistor MP4 and a fifth PMOS transistor MP5.

The first termination resistor Rt1 is connected between the positive transmission pin TXP and the source of the fourth PMOS transistor MP4.

The second termination resistor Rt2 is connected between the negative transmission pin TXN and the drain of the fifth PMOS transistor MP5. The drain of the fourth PMOS transistor MP4 and the source of the fifth PMOS transistor MP5 are connected.

The first termination resistor Rt1 and the second termination resistor Rt2 may have the same resistance. For example, the resistance of the first termination resistor Rt1 and of the second termination resistor Rt2 may each be about 150 ohms.

The fourth PMOS transistor MP4 and the fifth PMOS transistor MP5 may be formed on the semiconductor well region biased by the bias voltage Vbias provided from the bias unit 110. The well region may be an N-type well doped with N-type impurities. The fourth PMOS transistor MP4 includes a source connected to the first termination resistor Rt1, a drain connected to the source of the fifth PMOS transistor MP5, and a gate connected to receive the termination resistor control signal CON_ST. The fifth PMOS transistor MP5 includes a source connected to the drain of the fourth PMOS transistor MP4, a drain connected to the second termination resistor Rt2, and a gate receiving the termination resistor control signal CON_ST.

The fourth PMOS transistor MP4 and the fifth PMOS transistor MP5 are configured to switchably (conditionally) connect the first termination resistor Rt1 and the second termination resistor Rt2 in series between the positive transmission pin TXP and the negative transmission pin TXN in response to a logic level of the termination resistor control signal CON_ST. For example, when the termination resistor control signal CON_ST is at a logic high level, the fourth PMOS transistor MP4 and the fifth PMOS transistor MP5 are turned OFF such that the first termination resistor Rt1 and the second termination resistor Rt2 are not connected between the positive transmission pin TXP and the negative transmission pin TXN. Alternatively, when the termination resistor control signal CON_ST is at a logic low level, the fourth PMOS transistor MP4 and the fifth PMOS transistor MP5 are turned ON such that the first termination resistor Rt1 and the second termination resistor Rt2 are connected in series between the positive transmission pin TXP and the negative transmission pin TXN.

As described above, the N-type well region on which the fourth PMOS transistor MP4 and the fifth PMOS transistor MP5 are formed may be biased by the bias voltage Vbias, and the bias voltage Vbias can reliably expected to be the higher voltage among the first voltage V1 and the second voltage V2. Therefore, the N-type well region will be reliably biased by the higher voltage among the first voltage V1 and the second voltage V2. The sources and the drains of the fourth PMOS transistor MP4 and the fifth PMOS transistor MP5 may include a semiconductor region doped with P+ type impurities, and the voltage applied to the sources and the drains of the fourth PMOS transistor MP4 and the fifth PMOS transistor MP5 may be lower than about 3.3V. Therefore, a forward voltage may not be applied to P-N diode junctions between the N-type well region and the sources and the drains of the fourth PMOS transistor MP4 and the fifth PMOS transistor MP5. As such, the termination resistor unit 120c may effectively prevent a leakage current that conventionally flows from the sources and the drains of the fourth PMOS transistor MP4 and the fifth PMOS transistor to the N-type well region.

The fourth PMOS transistor MP4 and the fifth PMOS transistor MP5 may have a voltage tolerance of about 1.8V or less. Therefore, since a voltage applied to the sources and the drains of the fourth PMOS transistor MP4 and the fifth PMOS transistor MP5 may be up to about 3.3V, a voltage of a logic low level of the termination resistor control signal CON_ST, which is applied to the gates of the fourth PMOS transistor MP4 and the fifth PMOS transistor MP5, may be higher than about 1.5V.

Comparing the termination resistor unit 120c of FIG. 6 to the termination resistor unit 120a of FIG. 4, while the termination resistor unit 120a includes only one PMOS transistor MP3 for controlling the connection of the first termination resistor Rt1 and the second termination resistor Rt2 in series between the positive transmission pin TXP and the negative transmission pin TXN, the termination resistor unit 120c include two series-connected PMOS transistors MP4 and MP5 for controlling a connection of the first termination resistor Rt1 and the second termination resistor Rt2 in series between the positive transmission pin TXP and the negative transmission pin TXN.

As described above, one of the first voltage V1 and the second voltage V2 is about 3.3V and the other of the first voltage V1 and the second voltage V2 is about 2.7V. According to the termination resistor unit 120a of FIG. 4, when a voltage of a logic high level of the termination resistor control signal CON_ST is lower than about 3.3V, the third PMOS transistor MP3 may be weakly turned ON even if the gate-source voltage of the third PMOS transistor MP3 is lower than the threshold voltage of the third PMOS transistor MP3. Therefore, the termination resistor unit 120a may not completely disconnect the first termination resistor Rt1 and the second termination resistor Rt2 from between the positive transmission pin TXP and the negative transmission pin TXN even if the termination resistor control signal CON_ST is at a logic high level.

On the other hand, according to the termination resistor unit 120c of FIG. 6, when a voltage of a logic high level of the termination resistor control signal CON_ST is lower than about 3.3V but higher than the median of the first voltage V1 and the second voltage V2, (e.g., higher than about 3.0V), one of the fourth PMOS transistor MP4 and the fifth PMOS transistor MP5 may be weakly turned ON but the other of the fourth PMOS transistor MP4 and the fifth PMOS transistor MP5 will be completely turned OFF since the voltage applied to its gate is equal to or higher than the voltage of its source. Therefore, the termination resistor unit 120c will reliably completely disconnect the first termination resistor Rt1 and the second termination resistor Rt2 between the positive transmission pin TXP and the negative transmission pin TXN when the termination resistor control signal CON_ST is at a logic high level.

Figure 7:
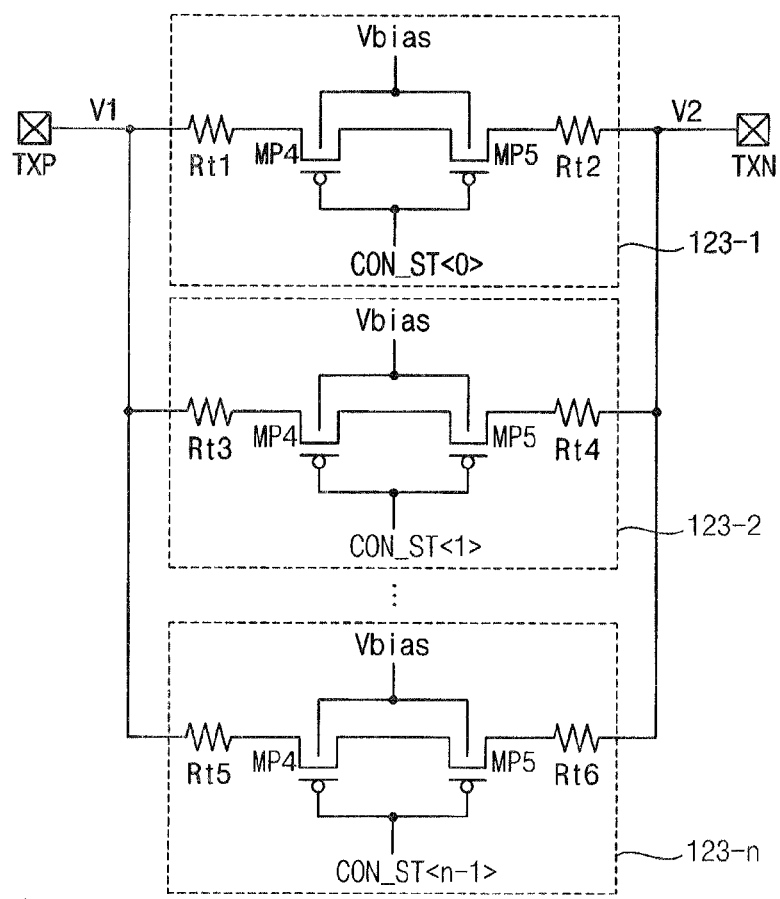

FIG. 7 is a circuit diagram of still another example of a termination resistor unit included in the termination circuit of FIG. 1.

Referring to FIG. 7, a termination resistor unit 120d may include a plurality of termination resistor blocks 123-1, 123-2, . . . , 123-n (n is a positive integer) connected in parallel between the positive transmission pin TXP and the negative transmission pin TXN.

The first termination resistor block 123-1 includes a first termination resistor Rt1, a second termination resistor Rt2, a fourth PMOS transistor MP4 and a fifth PMOS transistor MP5. The second termination resistor block 123-2 includes a third termination resistor Rt2, a fourth termination resistor Rt4, a fourth PMOS transistor MP4 and a fifth PMOS transistor MP5. Each n-th termination resistor block 123-n includes a fifth termination resistor Rt5, a sixth termination resistor Rt6, a fourth PMOS transistor MP4 and a fifth PMOS transistor MP5.

Each of the plurality of termination resistor blocks 123-1, 123-2, . . . , 123-n may have the same structure as the termination resistor unit 120c of FIG. 6. Thus, the termination resistor unit 120d of FIG. 7 may include a plurality of the termination resistor units 120c of FIG. 6 connected in parallel between the positive transmission pin TXP and the negative transmission pin TXN. Therefore, a redundant detailed description of the plurality of termination resistor blocks 123-1, 123-2, . . . , 123-n will be omitted.

In some exemplary embodiments, the first to the sixth termination resistors Rt1, Rt2, Rt3, Rt4, Rt5 and Rt6 all have the same resistance. In some other exemplary embodiments, the first to the sixth termination resistors Rt1, Rt2, Rt3, Rt4, Rt5 and Rt6 may have different resistances from each other.

The termination resistor control signal CON_ST may comprise n bits, and the fourth PMOS transistor MP4 and the fifth PMOS transistor MP5 included in each of the plurality of termination resistor blocks 123-1, 123-2, . . . , 123-n may be controlled by a corresponding one bit of the n-bit termination resistor control signal CON_ST. For example, the fourth PMOS transistor MP4 and the fifth PMOS transistor MP5 included in the first termination resistor block 123-1 may be controlled by a first bit of the n-bit termination resistor control signal CON_ST<0>, the fourth PMOS transistor MP4 and the fifth PMOS transistor MP5 included in the second termination resistor block 123-2 may be controlled by a second bit of the n-bit termination resistor control signal CON_ST<1>, and the fourth PMOS transistor MP4 and the fifth PMOS transistor MP5 included in the n-th termination resistor block 123-n may be controlled by the n-th bit of the termination resistor control signal CON_ST<n–>.

As illustrated in FIG. 7, the termination resistor unit 120d may adjust the total resistance of a conditional termination resistor connected between the positive transmission pin TXP and the negative transmission pin TXN by controlling the number of the termination resistor blocks that are turned ON using the n-bit termination resistor control signal CON_ST. For example, considering a case that the each of the first to the sixth termination resistors Rt1, Rt2, Rt3, Rt4, Rt5 and Rt6 has a resistance of 150 ohms, the termination resistor unit 120d may provide a maximum total termination resistance of 300 ohm between the positive transmission pin TXP and the negative transmission pin TXN by turning on one termination resistor block, and provide a termination resistor of 150 ohms between the positive transmission pin TXP and the negative transmission pin TXN by turning on two termination resistor blocks.

Figure 8:
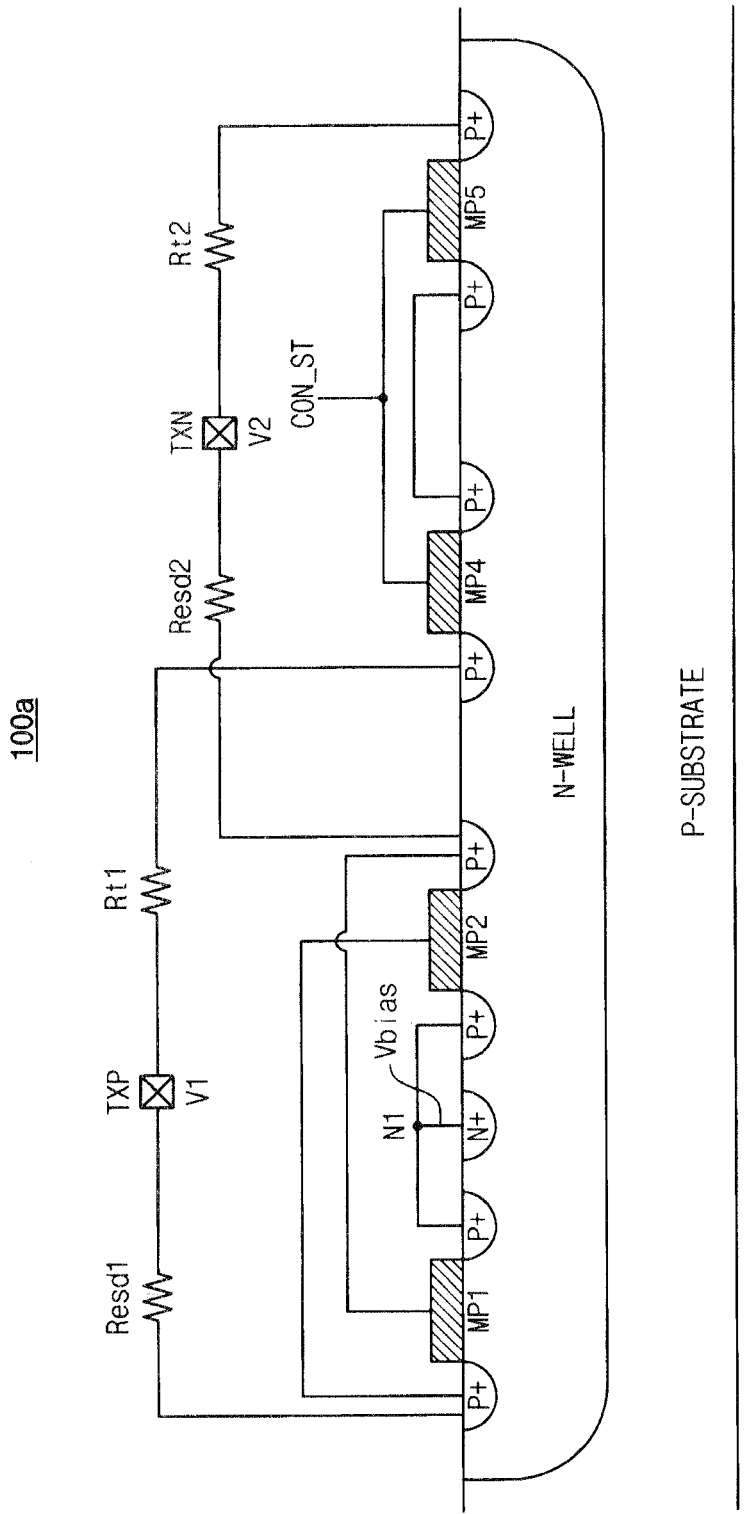
FIG. 8 is a cross sectional view of an example of the termination circuit of FIG. 1.

FIG. 8 is a cross sectional view of an example of the termination circuit of FIG. 1.

The termination circuit 100a of FIG. 8 is an example of the termination circuit 100 when the termination circuit 100 includes the bias unit 110b of FIG. 3 and the dual-transistor termination resistor unit 120c of FIG. 6.

Referring to FIG. 8, an N-type well region N-WELL is formed on a P-type semiconductor substrate P-SUBSTRATE. The first PMOS transistor MP1 and the second PMOS transistor MP2 included in the bias unit 110b and the fourth PMOS transistor MP4 and the fifth PMOS transistor MP5 included in the termination resistor unit 120c each include gate electrodes formed on the N-type well region.

As described above, the bias unit 110b outputs the bias voltage Vbias at the first node N1 by selecting the higher voltage among the first voltage V1 received through the positive transmission pin TXP and the second voltage V2 received through the negative transmission pin TXN. The first node N1 may be connected to the N-type well region through an area formed in the N-type well region and doped with N+ impurities. Therefore, the N-type well region on which the first PMOS transistor MP1, the second PMOS transistor MP2, the fourth PMOS transistor MP4 and the fifth PMOS transistor MP5 are formed may be biased by the bias voltage Vbias.

Since the N-type well region is biased by the higher voltage among the first voltage V1 and the second voltage V2, a forward voltage will not be applied to P-N diode junctions between the N-type well region and sources and drains of the first PMOS transistor MP1, the second PMOS transistor MP2, the fourth PMOS transistor MP4 and the fifth PMOS transistor MP5. Therefore, the termination circuit 100a may effectively prevent a leakage current that conventionally flows from the sources and the drains of the first PMOS transistor MP1, the second PMOS transistor MP2, the fourth PMOS transistor MP4 and the fifth PMOS transistor MP5 to the N-type well region.

The circuit structure of the termination circuit 100a that includes the bias unit 110b of FIG. 3 and the termination resistor unit 120c of FIG. 6 is described above with reference to FIG. 8. The termination circuit 100 that includes the bias unit 110a and one of the termination resistor units 120a, 120b and 102d may have similar circuit structure as the termination circuit 100a of FIG. 8.

As described with reference to FIGS. 1 to 8, the bias unit 110 and the termination resistor unit 120 need not include a separate power source but may operate using only the first voltage V1 and the second voltage V2.

Figure 9:
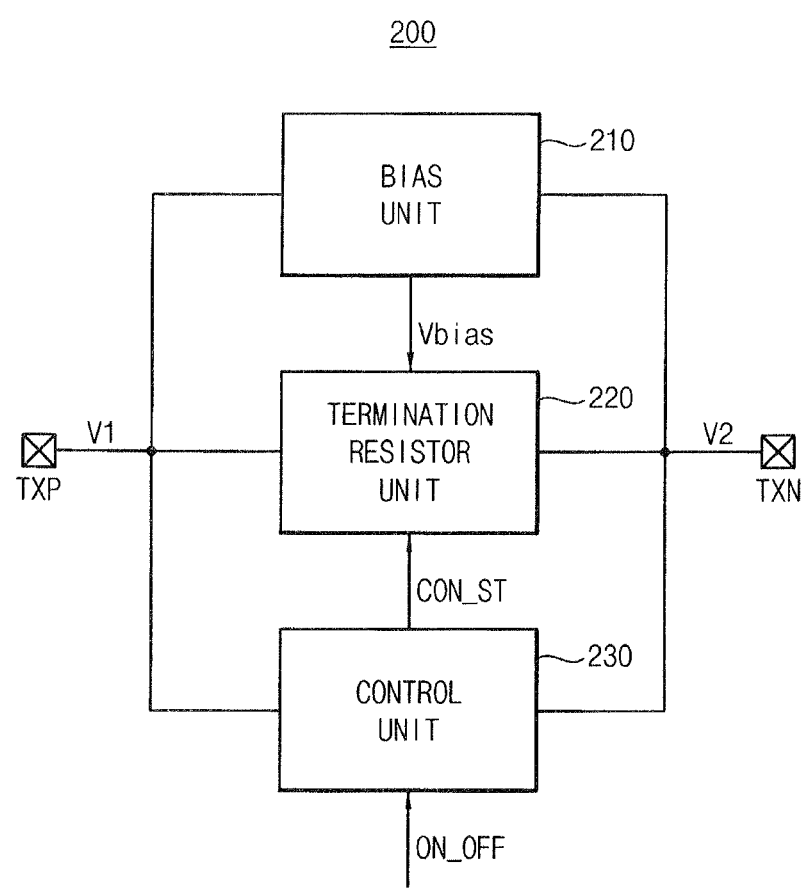
FIG. 9 is a block diagram of a termination circuit according to exemplary embodiments.

FIG. 9 is a block diagram of a termination circuit according to exemplary embodiments.

An exemplary implementation of termination circuit 200 of FIG. 9 may be used for a HDMI transmitter.

Referring to FIG. 9, the termination circuit 200 includes a bias unit 210, a termination resistor unit 220 and a control unit 230.

Comparing to the termination circuit 100 of FIG. 1, the termination circuit 200 further includes the control unit 230. The bias unit 210 and the termination resistor unit 220 included in the termination circuit 200 may have the same structure and manner of operation as the bias unit 110 and the termination resistor unit 120 included in the termination circuit 100. The structure and operation of the bias unit 110 and the termination resistor unit 120 included in the termination circuit 100 are thus described above with reference to FIGS. 1 to 8. Therefore, a redundant detailed description of the bias unit 210 and the termination resistor unit 220 included in the termination circuit 200 will be omitted.

The control unit 230 converts the voltage level of an ON/OFF control signal ON_OFF to generate the termination resistor control signal CON_ST. The ON/OFF control signal ON_OFF may be provided from an external device.

The control unit 230 need not include any additional power source and may generate the termination resistor control signal CON_ST by converting a voltage level of the ON/OFF control signal ON_OFF using only the first voltage V1 and the second voltage V2. The control unit 230 may generate the termination resistor control signal CON_ST by converting voltages of a logic high level and of a logic low level of the ON/OFF control signal ON_OFF into voltages that are able to drive individual PMOS transistors included in the termination resistor unit 220 without exceeding the voltage tolerance of the PMOS transistors. As described above, the third PMOS transistor MP3, the fourth PMOS transistor MP4 and the fifth PMOS transistor MP5 included in the termination resistor unit 220 may have a voltage tolerance of about 1.8V or less. Since the voltage applied to the sources and the drains of the third PMOS transistor MP3, the fourth PMOS transistor MP4 and the fifth PMOS transistor MP5 may be up to about 3.3V, the active voltage of the termination resistor control signal CON_ST, which is applied to the gates of the third PMOS transistor MP3, the fourth PMOS transistor MP4 and the fifth PMOS transistor MP5, may be equal to or higher than about 1.5V.

Figure 10:
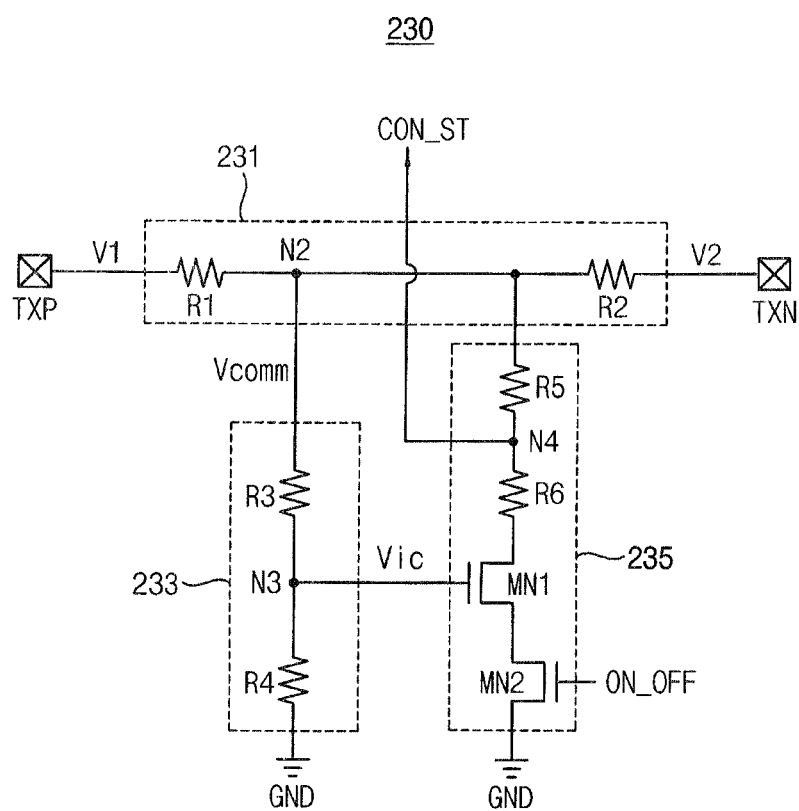
FIG. 10 is a circuit diagram of an example of a control unit included in the termination circuit of FIG. 9.

FIG. 10 is a circuit diagram of an example of a control unit included in the termination circuit of FIG. 9.

Referring to FIG. 10, the control unit 230 may include a common voltage generation unit 231, a voltage drop unit 233 and a voltage conversion unit 235.

The common voltage generation unit 231 generates a common voltage Vcomm using the first voltage V1 and the second voltage V2. The common voltage Vcomm may have a voltage between the first voltage V1 and the second voltage V2. As described above, since one of the first voltage V1 and the second voltage V2 is about 3.3V and the other of the first voltage V1 and the second voltage V2 is about 2.7V, the common voltage Vcomm may be about 3.0V.

The common voltage generation unit 231 may include a first resistor R1 and a second resistor R2. The first resistor R1 is connected between the positive transmission pin TXP and a second node N2. The second resistor R2 is connected between the negative transmission pin TXN and the second node N2. The first resistor R1 and the second resistor R2 may have the same resistance. Thus the common voltage generation unit 231 may output the common voltage Vcomm at the second node N2.

The voltage drop unit 233 may generate an inner control voltage Vic by dividing the voltage of the common voltage Vcomm.

The voltage drop unit 233 may include a third resistor R3 and a fourth resistor R4. The third resistor R3 is connected between the second node N2 and a third node N3. The fourth resistor R4 is connected between the third node N3 and a ground voltage GND. The voltage drop unit 233 may thus divide the common voltage Vcomm using the third resistor R3 and the fourth resistor R4 and thus output the inner control voltage Vic at the third node N3 having a voltage lower than the common voltage Vcomm.

As will be described below, the inner control voltage Vic may be used to control the first NMOS(N-type Metal Oxide Semiconductor) transistor MN1 included in the voltage conversion unit 235. Therefore, the ratio of the third resistor R3 to the fourth resistor R4 may be adjusted such that the inner control voltage Vic is able to drive the first NMOS transistor MN1 without exceeding the voltage tolerance of the first NMOS transistor MN1.

According to the HDMI standard, a HDMI transmitter may conduct a current up to 200 uA from a voltage of about 3.3V received from a HDMI receiver even if the HDMI transmitter is turned OFF. Therefore, the first resistor R1 and the second resistor R2 included in the common voltage generation unit 231 and the third resistor R3 and the fourth resistor R4 included in the voltage divider unit 233 preferably have a very large resistance such as mega ohms, so that the transmitter-OFF current that flows through the common voltage generation unit 231 and the voltage divider unit 233 will be lower than 200 uA.

The voltage conversion unit 235 generates the termination resistor control signal CON_ST in response to the ON/OFF control signal ON_OFF using the common voltage Vcomm and the inner control voltage Vic. The termination resistor control signal CON_ST has a voltage substantially equal to the common voltage Vcomm when the ON/OFF control signal ON_OFF is at a logic low level, and has a voltage lower than the common voltage Vcomm when the ON/OFF control signal ON_OFF is at a logic high level. The resulting ON/OFF control signal ON_OFF may have a voltage of about 0V in a logic low level and have a voltage of about 1.8V or less in a logic high level. Thus, the control unit 230 inverts and level-shifts the ON/OFF control signal ON_OFF.

The voltage conversion unit 235 may include a fifth resistor R5, a sixth resistor R6, the first NMOS transistor MN1 and a second NMOS transistor MN2.

The fifth resistor R5 is connected between the second node N2 and a fourth node N4. The sixth resistor R6 is connected between the fourth node N4 and the drain of the first NMOS transistor MN1. The first NMOS transistor MN1 includes its source connected to the drain of the second NMOS transistor MN2, its gate connected to receive the inner control voltage Vic, and its drain connected to the sixth resistor R6. The second NMOS transistor MN2 includes its source connected to the ground voltage GND, its gate configured to receive the ON/OFF control signal ON_OFF, and its drain connected to the source of the first NMOS transistor MN1.

The voltage conversion unit 235 outputs the termination resistor control signal CON_ST at the fourth node N4.

The first NMOS transistor MN1 and the second NMOS transistor MN2 may have a voltage tolerance of about 1.8V or less. Therefore, the gate-source voltages and the gate-drain voltages of the first NMOS transistor MN1 and the second NMOS transistor MN2 may need to be kept lower than about 1.8V.

The ON/OFF control signal ON_OFF may have a voltage of about 0V in a logic low level and have a voltage of about 1.8V or less in a logic high level. For example, the ON/OFF control signal ON_OFF may have a voltage of about 0V in a logic low level and have a voltage of about 1.0V in a logic high level. Therefore, the gate-source voltage of the second NMOS transistor MN2 may be kept lower than about 1.8V.

If the voltage conversion unit 235 does not include the first NMOS transistor MN1 so that the sixth resistor R6 is directly connected to the drain of the second NMOS transistor MN2, reliability of the control unit 230 may be degraded. Thus, when the ON/OFF control signal ON_OFF of a logic low level, which has a voltage of about 0V, is applied to the gate of the second NMOS transistor MN2, the second NMOS transistor MN2 may be turned OFF and the common voltage Vcomm may be applied to the drain of the second NMOS transistor MN2 since no current flows from the second node N2 through the voltage conversion unit 235. As described above, since the common voltage Vcomm may have a voltage of about 3.0V, the gate-drain voltage of the second NMOS transistor MN2 may become about 3.0V, which exceeds the voltage tolerance of the second NMOS transistors MN2.

However, since the voltage conversion unit 235 includes the first NMOS transistor MN1 between the sixth resistor R6 and the drain of the second NMOS transistor MN2, the common voltage Vcomm will not be applied to the drain of the second NMOS transistor MN2 even if the ON/OFF control signal ON_OFF of a logic low level, which has a voltage of about 0V, is applied to the gate of the second NMOS transistor MN2. Therefore, the second NMOS transistor MN2 may operate without exceeding the voltage tolerance of the second NMOS transistor MN2.

As described above, the voltage drop unit 233 may provide the voltage conversion unit 235 with the inner control voltage Vic that is able to drive the first NMOS transistor MN1 without exceeding the voltage tolerance of the first NMOS transistor MN1. Therefore, the gate-source voltage and the gate-drain voltage of the first NMOS transistor MN1 may be kept lower than about 1.8V.

Hereinafter, the preferred operation of the control unit 230 will be described with reference to FIGS. 9 and 10.

When the ON/OFF control signal ON_OFF is at a logic low level, the second NMOS transistor MN2 is turned OFF such that no current flows from the second node N2 through the voltage conversion unit 235. Therefore, the voltage of the fourth node N4 may be the same as a voltage of the second node N2, being at the common voltage Vcomm. As such, the control unit 230 then outputs the common voltage Vcomm at the fourth node N4 to the termination resistor unit 220 as the termination resistor control signal CON_ST of a logic high level.

Alternatively, when the ON/OFF control signal ON_OFF is at a logic high level, the second NMOS transistor MN2 may be turned ON such that a current flows from the second node N2 through the voltage conversion unit 235. Therefore, the voltage of the fourth node N4 may be lower than the voltage of the second node N2, (e.g., the common voltage Vcomm). As such, the control unit 230 then outputs a voltage lower than the common voltage Vcomm at the fourth node N4 to the termination resistor unit 220 as the termination resistor control signal CON_ST of a logic low level.

As described above, the termination resistor control signal CON_ST may be applied to the gates of the third PMOS transistor MP3, the fourth PMOS transistor MP4 and the fifth PMOS transistor MP5 included in the termination resistor unit 220, and the third PMOS transistor MP3, the fourth PMOS transistor MP4 and the fifth PMOS transistor MP5 may have a voltage tolerance of about 1.8V or less. Since the voltage applied to the sources and the drains of the third PMOS transistor MP3, the fourth PMOS transistor MP4 and the fifth PMOS transistor MP5 may be up to about 3.3V, resistances of the fifth resistor R5 and the sixth resistor R6 of the voltage conversion unit 235 will preferably be determined such that the voltage of a logic low level of the termination resistor control signal CON_ST may be equal to or higher than about 1.5V. Therefore, the termination circuit 200 may operate without degrading reliability.

As described with reference to FIG. 10, the control unit 230 need not include any additional power source but can operate using only the first voltage V1 and the second voltage V2.

Figure 11:
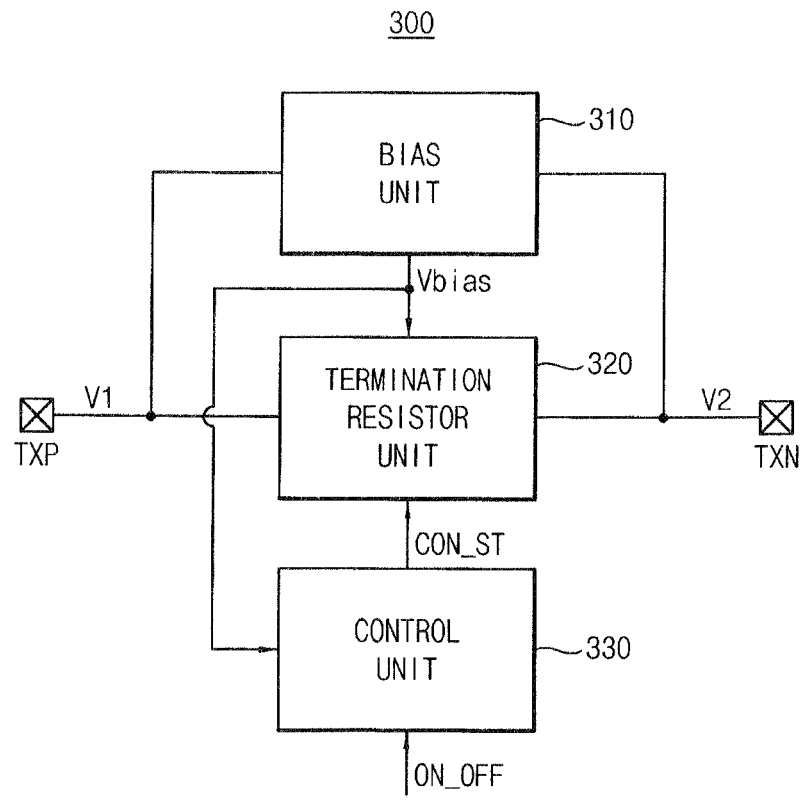
FIG. 11 is a block diagram of a termination circuit according to exemplary embodiments.

FIG. 11 is a block diagram of a termination circuit according to exemplary embodiments.

The termination circuit 300 of FIG. 11 may be used for a HDMI transmitter.

Referring to FIG. 11, the termination circuit 300 includes a bias unit 310, a termination resistor unit 320 and a control unit 330.

Compared with the termination circuit 100 of FIG. 1, the termination circuit 300 further includes the control unit 330. The bias unit 310 and the termination resistor unit 320 included in the termination circuit 300 may have the same structure and operation as the bias unit 110 and the termination resistor unit 120 included in the termination circuit 100. The structure and operation of the bias unit 110 and the termination resistor unit 120 included in the termination circuit 100 are described above with reference to FIGS. 1 to 8. Therefore, a redundant detailed description of the bias unit 310 and the termination resistor unit 320 included in the termination circuit 300 will be omitted.

The control unit 330 converts a voltage level of an ON/OFF control signal ON_OFF to generate the termination resistor control signal CON_ST. The ON/OFF control signal ON_OFF may be provided from an external device.

The control unit 330 need not include any additional power source and may generate the termination resistor control signal CON_ST by converting the voltage level of the ON/OFF control signal ON_OFF using only the bias voltage Vbias received from the bias unit 310. The control unit 330 may generate the termination resistor control signal CON_ST by converting voltages of a logic high level and a logic low level of the ON/OFF control signal ON_OFF into voltages that are suited to drive PMOS transistors included in the termination resistor unit 320 without exceeding the voltage tolerance of the PMOS transistors. As described above, the third PMOS transistor MP3, the fourth PMOS transistor MP4 and the fifth PMOS transistor MP5 included in the termination resistor unit 320 may have a voltage tolerance of about 1.8V or less. Since a voltage applied to the sources and the drains of the third PMOS transistor MP3, the fourth PMOS transistor MP4 and the fifth PMOS transistor MP5 may be up to about 3.3V, a voltage of the termination resistor control signal CON_ST, which is applied to the gates of the third PMOS transistor MP3, the fourth PMOS transistor MP4 and the fifth PMOS transistor MP5, may be equal to or higher than about 1.5V.

Figure 12:
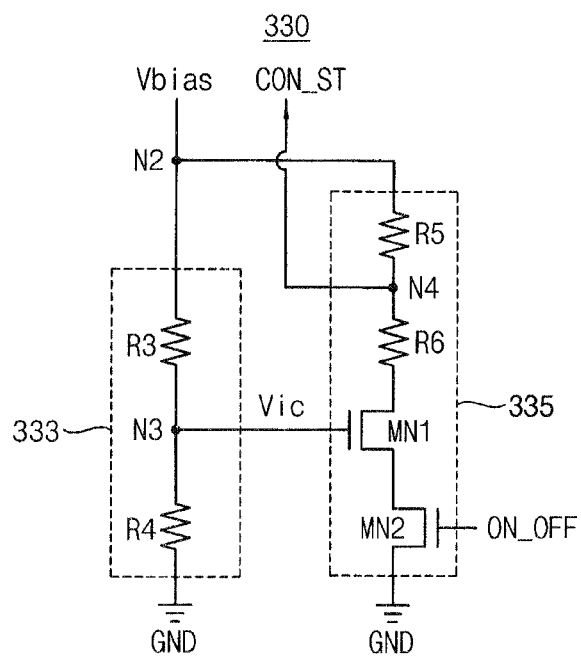
FIG. 12 is a circuit diagram of an example of a control unit included in the termination circuit of FIG. 11.

FIG. 12 is a circuit diagram of an example of a control unit included in the termination circuit of FIG. 11.

Referring to FIG. 12, the control unit 330 includes a voltage drop unit 333 and a voltage conversion unit 335.

The voltage drop unit 333 receives the bias voltage Vbias from the bias unit 310 and generates an inner control voltage Vic by dropping (e.g., dividing) the voltage of the bias voltage Vbias.

The voltage conversion unit 335 generates the termination resistor control signal CON_ST in response to the ON/OFF control signal ON_OFF using the bias voltage Vbias and the inner control voltage Vic. The termination resistor control signal CON_ST thus has a voltage substantially equal to the bias voltage Vbias when the ON/OFF control signal ON_OFF is at a logic low level, and has a voltage lower than the bias voltage Vbias when the ON/OFF control signal ON_OFF is at a logic high level. Thus, the control unit 330 inverts and level-shifts the ON/OFF control signal ON_OFF.

Compared with the control unit 230 of FIG. 10, the control unit 330 does not include a common voltage generation unit that outputs a common voltage at the second node N2 but instead receives the bias voltage Vbias at the second node N2 from the bias unit 310. Thus, the voltage drop unit 333 and the voltage conversion unit 335 included in the control unit 330 have the same structure and operation as the voltage drop unit 233 and the voltage conversion unit 235 included in the control unit 230. The structure and preferred operation of the voltage drop unit 233 and the voltage conversion unit 235 included in the control unit 230 are described above with reference to FIG. 10. Therefore, a redundant detailed description of the voltage drop unit 333 and the voltage conversion unit 335 included in the control unit 330 will be omitted.

Hereinafter, the operation of the control unit 330 will be described with reference to FIGS. 11 and 12.

When the ON/OFF control signal ON_OFF is at a logic low level, the second NMOS transistor MN2 is turned OFF such that no current flows from the second node N2 through the voltage conversion unit 335. Therefore, the voltage of the fourth node N4 will be the same as the voltage of the second node N2, e.g., the bias voltage Vbias. As such, the control unit 330 then outputs the bias voltage Vbias at the fourth node N4 to the termination resistor unit 320 as the termination resistor control signal CON_ST of a logic high level.

Alternatively, when the ON/OFF control signal ON_OFF is at a logic high level, the second NMOS transistor MN2 is turned ON such that a current flows from the second node N2 through the voltage conversion unit 335. Therefore, the voltage of the fourth node N4 will be lower than the voltage of the second node N2, e.g., the bias voltage Vbias. As such, the control unit 330 then outputs a voltage lower than the bias voltage Vbias at the fourth node N4 to the termination resistor unit 320 as the termination resistor control signal CON_ST of a logic low level.

As described above, the termination resistor control signal CON_ST may be applied to the gates of the third PMOS transistor MP3, the fourth PMOS transistor MP4 and the fifth PMOS transistor MP5 included in the termination resistor unit 320, and the third PMOS transistor MP3, the fourth PMOS transistor MP4 and the fifth PMOS transistor MP5 may have a voltage tolerance of about 1.8V or less. Since the voltage applied to the sources and the drains of the third PMOS transistor MP3, the fourth PMOS transistor MP4 and the fifth PMOS transistor MP5 may be up to about 3.3V, resistances of the fifth resistor R5 and the sixth resistor R6 of the voltage conversion unit 335 will preferably be determined such that the voltage of a logic low level of the termination resistor control signal CON_ST will be equal to or higher than about 1.5V. Therefore, the termination circuit 300 may operate without degrading reliability.

As described with reference to FIG. 12, the control unit 330 need not include any additional power source but operate using only the bias voltage Vbias provided from the bias unit 310.

In a conventional termination circuit, a well region on which MOS transistors are formed is not biased at all or is biased by a voltage lower than either one of the voltage received through the positive transmission pin and the voltage received through the negative transmission pin. Therefore, a leakage current may conventionally flow from the sources and the drains of the MOS transistors to the well region.

On the other hand, as described above with reference to FIGS. 1 to 12, the conditional termination circuits 100, 200 and 300 may be formed on the well region biased by the highest voltage selected from among the first voltage V1 received through the positive transmission pin TXP and the second voltage V2 received through the negative transmission pin TXN. Therefore, the termination circuits 100, 200 and 300 may effectively prevent the conventional leakage current.

Conventional termination circuits are embodied using MOS transistors having a voltage tolerance of about 3.3V. However, as a semiconductor process technique advances, such as a deep submicron process, it becomes difficult to produce MOS transistors having a voltage tolerance up to 3.3V. Therefore, it becomes difficult to produce a conventional termination circuit on a chip.

On the other hand, the conditional termination circuits 100, 200 and 300 may include MOS transistors having a voltage tolerance lower than about 3.3V without degrading reliability. Therefore, the termination conditional circuits 100, 200 and 300 may be embodied on a chip even by an advanced process technique, such as a deep submicron process.

Figure 13:
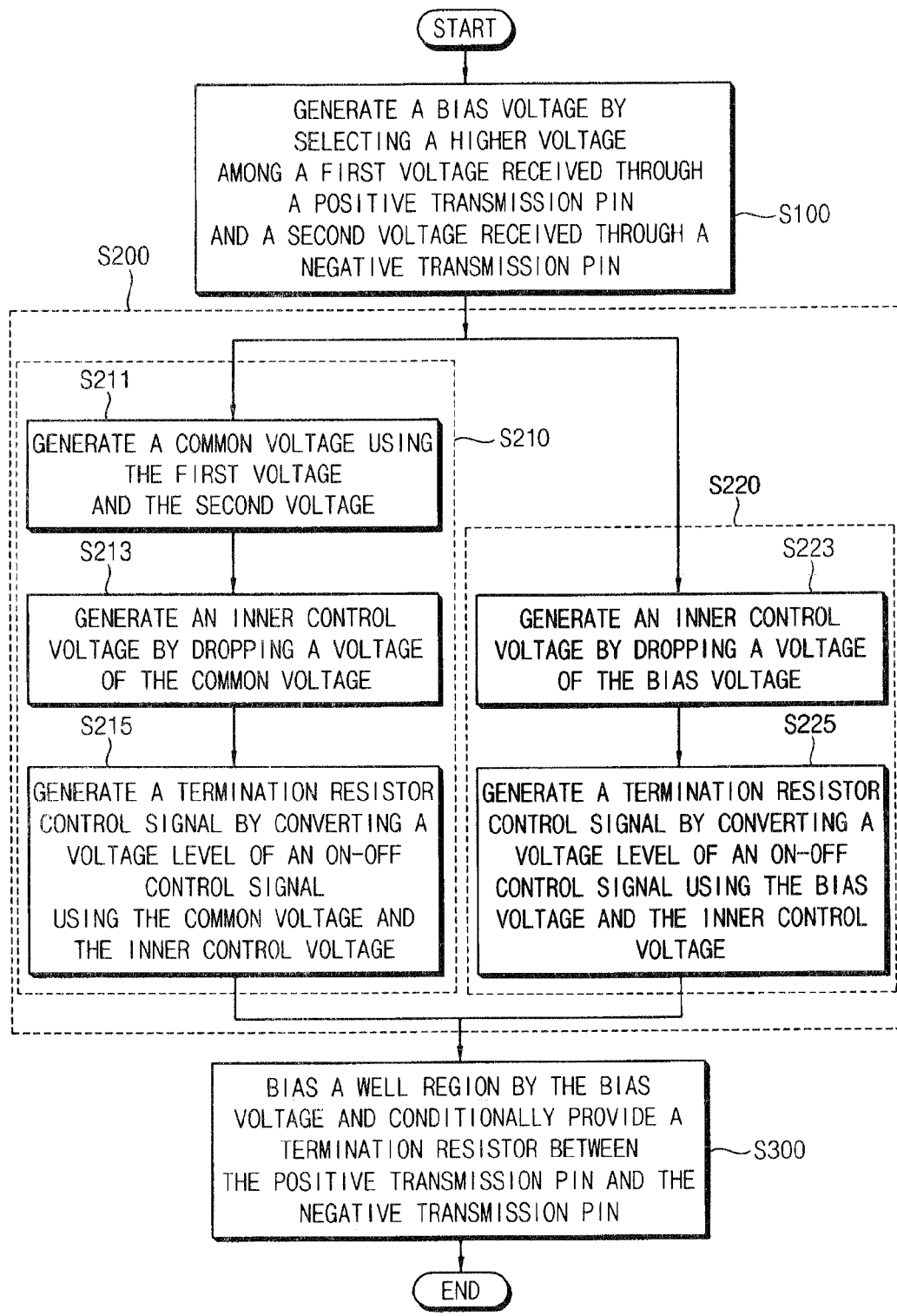
FIG. 13 is a flow chart of a method of providing a conditional termination resistor according to exemplary embodiments.

FIG. 13 is a flow chart of a method of providing a conditional termination resistor according to exemplary embodiments.

The method of providing a conditional termination resistor of FIG. 13 may be used for a HDMI transmitter.

The method of providing a conditional termination resistor of FIG. 13 may be performed by the conditional termination circuits 100, 200 and 300.

Referring to FIGS. 1 to 13, the bias voltage Vbias is generated by selecting the higher voltage among the first voltage V1 received through the positive transmission pin TXP and the second voltage V2 received through the negative transmission pin TXN S100. For example, the bias voltage Vbias may be generated using the first PMOS transistor MP1 and the second PMOS transistor MP2 connected between the positive transmission pin TXP and the negative transmission pin TXN. The gates and the drains of the first PMOS transistor MP1 and the second PMOS transistor MP2 may be cross-coupled.

The termination resistor control signal CON_ST is generated by converting (e.g., inverting and level-shifting) a voltage level of the ON/OFF control signal ON_OFF S200. The ON/OFF control signal ON_OFF may be provided from an external device.

In some exemplary embodiments, the termination resistor control signal CON_ST may be generated by converting a voltage level of the ON/OFF control signal ON_OFF using the first voltage V1 and the second voltage V2 S210. In this case, the common voltage Vcomm having a voltage between the first voltage V1 and the second voltage V2 may be generated using the first voltage V1 and the second voltage V2 S211, the inner control voltage Vic may be generated by dropping (e.g., dividing) the voltage of the common voltage Vcomm S213, and the termination resistor control signal CON_ST may be generated in response to (e.g., by inverting) the ON/OFF control signal ON_OFF using the common voltage Vcomm and the inner control voltage Vic S215. The termination resistor control signal CON_ST may have a voltage substantially equal to the common voltage Vcomm when the ON/OFF control signal ON_OFF is at a logic low level, and have a voltage lower than the common voltage Vcomm when the ON/OFF control signal ON_OFF is at a logic high level.

In other exemplary embodiments, the termination resistor control signal CON_ST may be generated by converting (e.g., inverting and level-shifting) the voltage level of the ON/OFF control signal ON_OFF using the bias voltage Vbias S220. In this case, the inner control voltage Vic may be generated by dropping (e.g., dividing) the voltage of the bias voltage Vbias S223, and the termination resistor control signal CON_ST may be generated in response to (e.g., by inverting) the ON/OFF control signal ON_OFF using the bias voltage Vbias and the inner control voltage Vic S225. The resulting termination resistor control signal CON_ST has a voltage substantially equal to the bias voltage Vbias when the ON/OFF control signal ON_OFF is at a logic low level, and has a voltage lower than the bias voltage Vbias when the ON/OFF control signal ON_OFF is at a logic high level.

The well region on which PMOS transistors are formed are biased by the bias voltage Vbias, and a termination resistance is conditionally provided between the positive transmission pin TXP and the negative transmission pin TXN in response to the termination resistor control signal CON_ST S300. For example, at least one PMOS transistor receiving the termination resistor control signal CON_ST as a control signal may operate as an ON/OFF switch so that a termination resistor is not connected between the positive transmission pin TXP and the negative transmission pin TXN while the termination resistor control signal CON_ST is at a logic high level, and the termination resistor is connected between the positive transmission pin TXP and the negative transmission pin TXN while the termination resistor control signal CON_ST is at a logic low level.

The method of providing a termination resistor of FIG. 13 may be used for a HDMI transmitter for conditionally providing the termination resistance between the positive transmission pin TXP and the negative transmission pin TXN. A HDMI transmitter operates using a voltage of about 3.3V provided by a HDMI receiver. However, the method of providing a conditional termination resistor of FIG. 13 may be performed by the termination circuit 100, 200 and 300 that includes the PMOS transistors having a voltage tolerance of about 1.8V or less. Therefore, a voltage of a logic low level of the termination resistor control signal CON_ST, which is used for controlling the PMOS transistor, may be controlled to be equal to or higher than about 1.5V.

Figure 14:
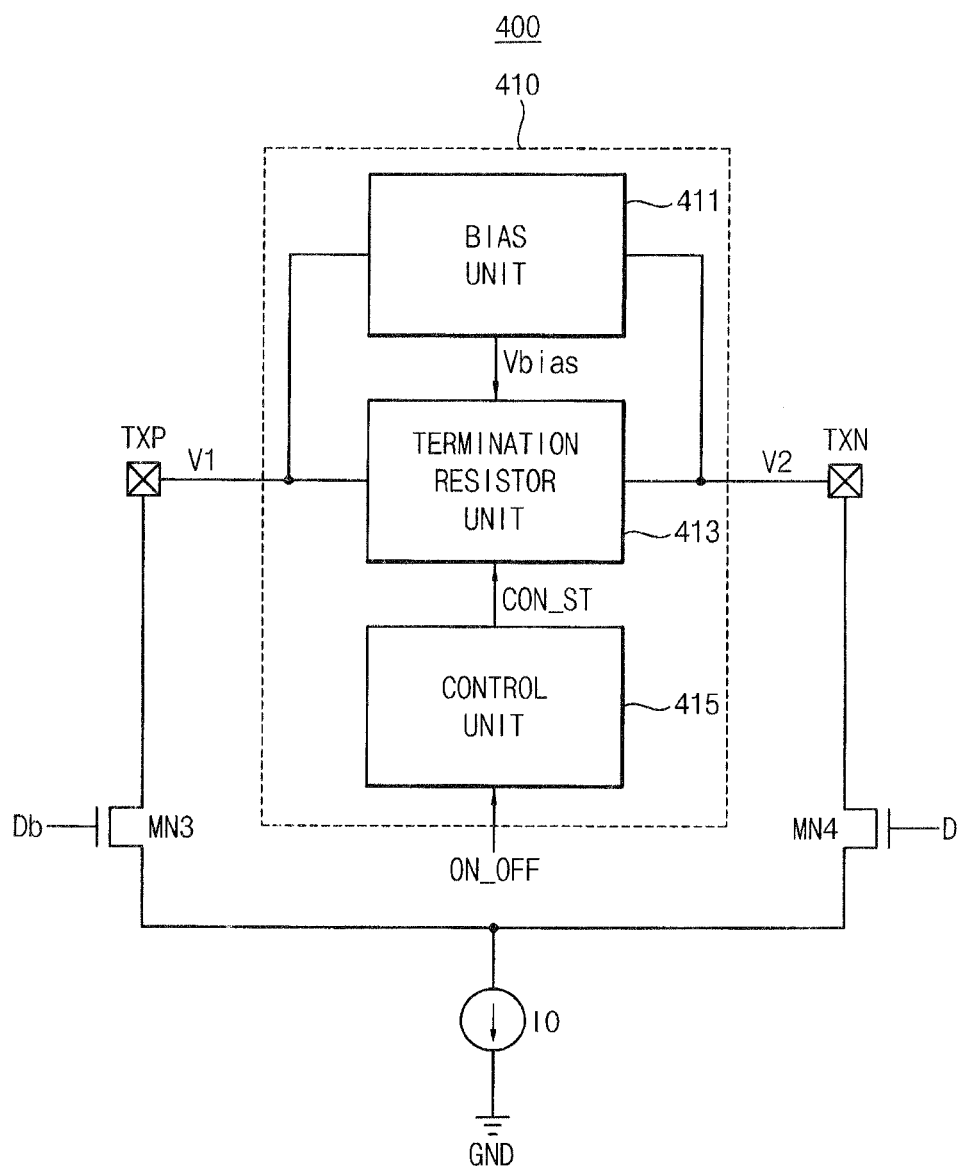
FIG. 14 is a block diagram of a HDMI transmitter according to exemplary embodiments.

FIG. 14 is a block diagram of a HDMI transmitter according to exemplary embodiments.

Referring to FIG. 14, a HDMI transmitter 400 includes a third NMOS transistor MN3, a fourth NMOS transistor MN4, a constant current source IO and a conditional termination circuit 410.

The fourth NMOS transistor MN4 includes its source connected to the current source IO, its drain connected to the negative transmission pin TXN, and its gate configured to receive a data signal D.

The third NMOS transistor MN3 includes its source connected to the current source IO, its drain connected to the positive transmission pin TXP, and its gate connected to receive an inverted data signal Db, which is an inverted version of the data signal D.

The constant current source is connected between the ground voltage GND and each of the third NMOS transistor MN3 and the fourth NMOS transistor MN4.

The third NMOS transistor MN3 and the fourth NMOS transistor MN4 can operate as a driver that transmits the data signal D to a HDMI receiver as current alternately through the positive transmission pin TXP and through the negative transmission pin TXN as a form of a differential signal.

The conditional termination circuit 410 conditionally provides a predetermined (e.g., dynamically selected) termination resistance between the positive transmission pin TXP and the negative transmission pin TXN in response to the ON/OFF control signal ON_OFF. At least a part of the conditional termination circuit 410 is formed on a well region biased by the higher voltage among the first voltage V1 received through the positive transmission pin TXP and the second voltage V2 received through the negative transmission pin TXN.

The conditional termination circuit 410 may include a bias unit 411, a termination resistor unit 413 and a control unit 415.

The bias unit 411 may be connected between the positive transmission pin TXP and the negative transmission pin TXN. The bias unit 411 may generate the bias voltage Vbias by selecting and outputting the higher voltage among the first voltage V1 and the second voltage V2.

The control unit 415 may convert (e.g., invert and/or level-shift) a voltage level of the ON/OFF control signal ON_OFF to generate the termination resistor control signal CON_ST.

The termination resistor unit 413 may be formed on the well region biased by the bias voltage Vbias, and conditionally provides the termination resistance between the positive transmission pin TXP and the negative transmission pin TXN in response to the termination resistor control signal CON_ST.

The termination circuit 410 may be implemented as either one of the termination circuit 200 of FIG. 9 and the termination circuit 300 of FIG. 11. The structure and operation of the termination circuit 200 and the termination circuit 300 are described above with reference to FIGS. 9 and 12. Therefore, a redundant detailed description of the termination circuit 410 will be omitted.

An operation of the HDMI transmitter 400 will be described below with reference to FIG. 15.

Figure 15:
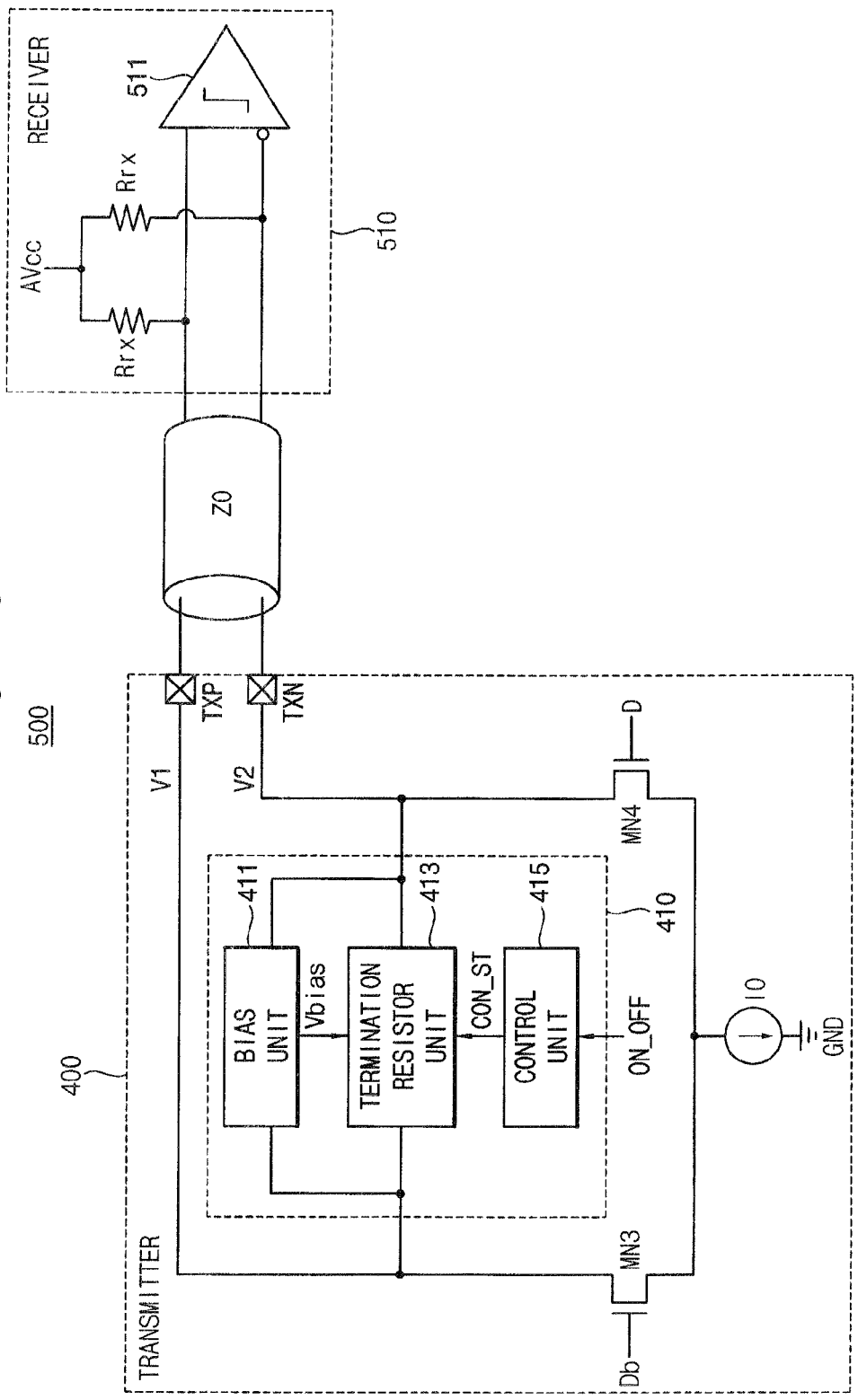
FIG. 15 is a block diagram of a HDMI system according to exemplary embodiments.

FIG. 15 is a block diagram of a HDMI system according to exemplary embodiments.

Referring to FIG. 15, a HDMI system 500 includes a HDMI transmitter 400, a HDMI receiver 510 and a transmission line Z0.

The HDMI transmitter 400 included in the HDMI system 500 may be implemented as the HDMI transmitter 400 of FIG. 14.

The positive transmission pin TXP and the negative transmission pin TXN of the HDMI transmitter 400 are connected to the HDMI receiver 510 through the transmission line Z0.

According to the HDMI standard, the HDMI receiver 510 alternately provides a supply voltage AVcc of about 3.3V to the positive transmission pin TXP and the negative transmission pin TXN of the HDMI transmitter 400 through the transmission line Z0. The HDMI transmitter 400 may operate using the voltage of about 3.3V received through the positive transmission pin TXP and through the negative transmission pin TXN from the HDMI receiver 510.

The HDMI receiver 510 may include a termination resistor Rrx between the supply voltage AVcc and the transmission line Z0 for decreasing a signal reflection on the HDMI receiver 510. The termination resistor Rrx may have the same impedance as the transmission line Z0. For example, when an impedance of the transmission line Z0 is 50 ohms, the termination resistor Rrx may have an impedance of 50 ohms.

The HDMI transmitter 400 may receive the data signal D and the inverted data signal Db, which are to be transmitted to the HDMI receiver 510, from an external device. As illustrated in FIGS. 14 and 15, the data signal D may be provided to the gate of the fourth NMOS transistor MN4 and the inverted data signal Db may be provided to the gate of the third NMOS transistor MM3.

When the data signal D is at a logic low level, the third NMOS transistor MN3 is turned ON, such that the current may flow from the supply voltage AVcc of the HDMI receiver 510 to the ground voltage GND through the transmission line Z0, the positive transmission pin TXP and the third NMOS transistor MN3. Therefore, the first voltage V1 of the positive transmission pin TXP may be about 2.7V and lower than the supply voltage AVcc since the supply voltage AVcc may drop along the transmission line Z0.

In addition, when the data signal D is at a logic low level, the fourth NMOS transistor MN4 is turned OFF, such that substantially no current may flow from the supply voltage AVcc of the HDMI receiver 510 to the ground voltage GND through the transmission line Z0, the negative transmission pin TXN and the fourth NMOS transistor MN4. Therefore, the second voltage V2 of the negative transmission pin TXN may be substantially equal to the supply voltage AVcc, which is about 3.3V.

Alternatively, when the data signal D is at a logic high level, the third NMOS transistor MN3 is turned OFF and the fourth NMOS transistor MN4 may be turned ON. Therefore, the first voltage V1 of the positive transmission pin TXP may be substantially equal to the supply voltage AVcc, which is about 3.3V, and the second voltage V2 of the negative transmission pin TXN may be about 2.7V and lower than the supply voltage AVcc since the supply voltage AVcc may drop along the transmission line Z0.

A comparator 511 included in the HDMI receiver 510 may determine the logic level of the data signal D by comparing the voltage of a signal transmitted through the positive transmission pin TXP with the voltage of a signal transmitted through the negative transmission pin TXN.

As described above, if the HDMI transmitter 400 does not include a termination resistor between the positive transmission pin TXP and the negative transmission pin TXN, as a data transmission speed increases, signal reflection on the HDMI transmitter 400 increases such that signal integrity is degraded. For this reason, the HDMI standard allows for a HDMI transmitter to couple a termination resistor between a positive transmission pin and a negative transmission pin when the data transmission speed is greater than 1.65 Gbps (Giga bit per second).

As illustrated in FIGS. 14 and 15, the HDMI transmitter 400 includes the conditional termination circuit 410 between the positive transmission pin TXP and the negative transmission pin TXN. The conditional termination circuit 410 conditionally provides a predetermined termination resistance between the positive transmission pin TXP and the negative transmission pin TXN in response to the ON/OFF control signal ON_OFF.

The termination circuit 410 may be implemented as one of the termination circuit 200 of FIG. 9 and the termination circuit 300 of FIG. 11. The structure and operation of the termination circuit 200 and the termination circuit 300 are described above with reference to FIGS. 9 and 12. Therefore, a redundant detailed description of the termination circuit 410 will be omitted.

Figure 16:
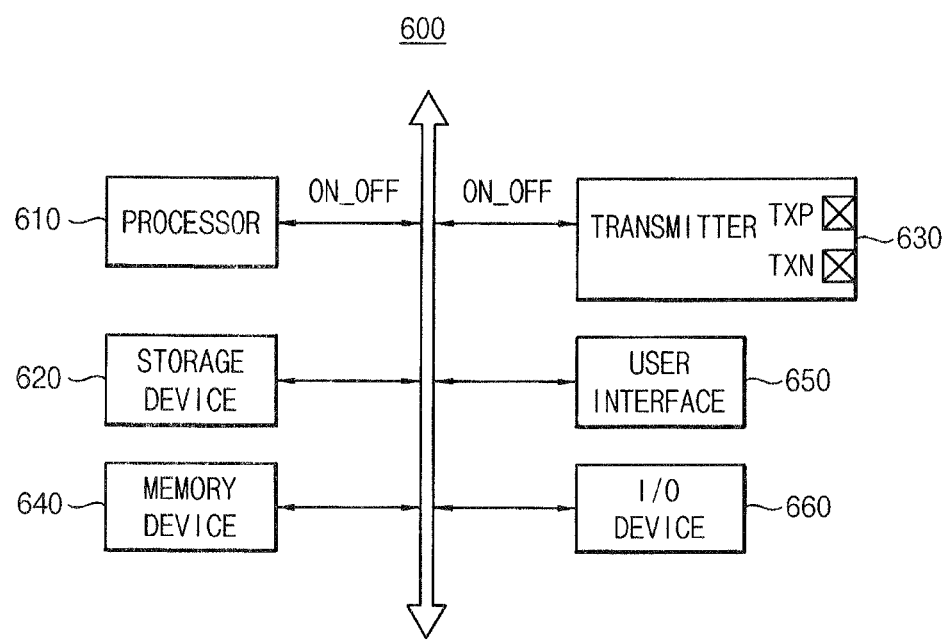
FIG. 16 is a block diagram of a multimedia source apparatus according to exemplary embodiments.

FIG. 16 is a block diagram of a multimedia source apparatus according to exemplary embodiments.

Referring to FIG. 16, a multimedia source apparatus 600 includes a processor 610, a storage device 620 and a HDMI transmitter 630.

The storage device 620 stores multimedia data. The storage device 620 may include a non-volatile memory device such as a flash memory device, a solid state drive (SSD), a hard disk drive (HHD), a CD-ROM, etc. The storage device 620 may be embodied as a removable memory card, such as an SD memory card.

The HDMI transmitter 630 transmits the multimedia data through the positive transmission pin TXP and the negative transmission pin TXN. The HDMI transmitter 630 conditionally provides a predetermined termination resistance between the positive transmission pin TXP and the negative transmission pin TXN in response to the ON/OFF control signal ON_OFF.

The HDMI transmitter 630 may be implemented as the HDMI transmitter 400 of FIG. 14. The structure and operation of the HDMI transmitter 400 are described above with reference to FIGS. 1 and 15. Therefore, a redundant detailed description of the HDMI transmitter 630 will be omitted.

The processor 610 controls the storage device 620 and the HDMI transmitter 630. The processor 610 reads the multimedia data from the storage device 620 and provides the multimedia data to the HDMI transmitter 630. The processor 610 provides the ON/OFF control signal ON_OFF to the HDMI transmitter 630.

The processor 610 may perform specific calculations, or computing functions for various tasks. For example, the processor 610 may include a microprocessor, a central processing unit (CPU), etc. The processor 610 may be connected to the storage device 620 and the HDMI transmitter 630 via an address bus, a control bus, and/or a data bus. In addition, the processor 610 may be connected to an extended bus such as a peripheral component interconnection (PCI) bus.

The processor 610 may be embodied as a single core architecture or a multi core architecture. For example, the processor 610 may be embodied as a single core architecture when an operating frequency of the processor 610 is less than 1 GHz, and the processor 610 may be embodied as a multi core architecture when an operating frequency of the processor 610 is greater than 1 GHz. The processor 610 is embodied as a multi core architecture and may communicate with peripheral devices via an advanced extensible interface (AXI) bus.

The multimedia source apparatus 600 may further include a memory device 640, a user interface 650 and an input/output device 660. Although not illustrated in FIG. 16, the multimedia source apparatus 600 may further include ports to communicate with a video card, a sound card, a memory card, a universal serial bus (USB) device, etc.

The memory device 640 may store data for operations of the multimedia source apparatus 600. For example, the memory device 640 may include at least one volatile memory device such as a dynamic random access memory (DRAM) device, a static random access memory (SRAM) device, etc. and/or at least one non-volatile memory device such as an erasable programmable read-only memory (EPROM) device, an electrically erasable programmable read-only memory (EEPROM) device, a flash memory device, etc.

The user interface 650 may include devices required for a user to control the multimedia source apparatus 600. The input/output device 660 may include an input device (e.g., a keyboard, a keypad, a mouse, etc.), an output device (e.g., a printer, a monitor, a speaker, etc.).

The multimedia source apparatus 600 may comprise any of several types of electronic devices, such as a digital versatile disk (DVD) player, a set-top box, a cellular phone, a smart phone, a personal digital assistant (PDA), a desktop computer, a laptop computer, a personal media player (PMP), a digital camera, etc.

The foregoing is illustrative of the present inventive concept and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A termination circuit for a HDMI (High Definition Multimedia Interface) transmitter, comprising:
    a first common node connected to a positive transmission pin of a differential pair of the HDMI transmitter;
    a second common node connected to a negative transmission pin of the differential pair of the HDMI transmitter;
    a termination resistor unit including a first connection transistor formed on a semiconductor well region biased by a bias voltage, and a first termination resistor and a second termination resistor; and
    a bias unit including a first transistor connected to the first common node and a second transistor connected to the second common node, and configured to generate the bias voltage based on a first voltage received through the first common node and a second voltage received through the second common node,
    wherein the termination resistor unit connected to the first common node and the second common node; and
    wherein the first connection transistor configured to conditionally connect the first termination resistor and the second termination resistor in response to a termination resistor control signal.

2. The termination circuit of claim 1, wherein the bias unit is configured to generate the bias voltage, by using the first transistor and the second transistor to select a higher voltage between the first voltage received through the first common node and the second voltage received through the second common node, and the higher voltage is about 3.3V.

3. The termination circuit of claim 1, wherein a drain of the first transistor and a gate of the second transistor are connected to the first common node, and
    wherein a drain of the second transistor and a gate of the first transistor are connected to the second common node.

4. The termination circuit of claim 1, wherein the first transistor is PMOS transistor and formed on an n-type well region biased by the bias voltage, and the second transistor is PMOS transistor and formed on an n-type well region biased by the bias voltage.

5. The termination circuit of claim 1, wherein the termination resistor unit further comprises:
    a second connection transistor formed on a semiconductor well region biased by the bias voltage,
    wherein a gate of the first connected transistor and a gate of the second connection transistor are connected; and
    wherein the first connection transistor and the second connection transistor are configured to conditionally connect the first termination resistor and the second termination resistor in response to the termination resistor control signal.

6. The termination circuit of claim 5, wherein a source of the first connection transistor is connected to the first termination resistor and a drain of the second connection transistor is connected to the second termination resistor.

7. The termination circuit of claim 1, wherein the terminal resistor control signal has n-bits and n is a positive integer.

8. The termination circuit of claim 7, further comprising:
    a second termination resistor unit including a second connection transistor formed on a semiconductor well region biased by the bias voltage, a third termination resistor and a fourth termination resistor,
    wherein the termination resistor unit and the second termination resistor unit are connected in parallel between the first common node and the second common node; and
    wherein the first connection transistor and the second connection transistor receive one of the n-bits included in the termination resistor control signal, respectively.

9. The termination circuit of claim 5, further comprising:
    a second termination resistor unit including a third connection transistor formed on a semiconductor well region biased by the bias voltage, a fourth connection transistor formed on a semiconductor well region biased by the bias voltage, a third termination resistor and a fourth termination resistor,
    wherein the termination resistor unit and the second termination resistor unit are connected in parallel between the first common node and the second common node;
    wherein third connection transistor and fourth connection transistor are connected to each other; and
    wherein the third connection transistor and the fourth connection transistor conditionally connect the third termination resistor and the fourth termination resistor between the first common node and the second common node in response to the termination resistor control signal.

10. The termination circuit of claim 1, further comprising:
    a control unit configured to generate the termination resistor control signal, and
    wherein the control unit is connected to the first common node and the second common node.

11. The termination circuit of claim 10, wherein the terminal resistor control signal is generated based on the first voltage received through the first common node as power source.

12. The termination circuit of claim 11, wherein a voltage of the terminal resistor control signal is lower than 3.3V.

13. The termination circuit of claim 10, wherein the control unit includes a switch configured to receive ON/OFF control signal, and
    wherein the terminal resistor control signal is generated based on the first voltage received through the first common node, the second voltage received through the second common node and the ON/OFF control signal.

14. The termination circuit of claim 13, wherein the voltage of the termination resistor control signal is equal to or higher than 1.5V when the switch is on.

15. The termination circuit of claim 10, wherein a drain of the first transistor and a gate of the second transistor are connected to the first common node, and wherein a drain of the second transistor and a gate of the first transistor are connected to the second common node.

16. The termination circuit of claim 15, wherein the termination resistor unit further comprises:
a second connection transistor formed on a semiconductor well region biased by the bias voltage,
wherein a gate of the first connection transistor and a gate of the second connection transistor are connected to each other; and
wherein the first connection transistor and the second connection transistor conditionally connect the first termination resistor and the second termination resistor between the first common node and the second common node in response to the termination resistor control signal.

17. A termination circuit for a HDMI (High Definition Multimedia Interface) transmitter, comprising:
a termination resistor unit including a first connection transistor formed on a semiconductor well region biased by a bias voltage, and configured to conditionally provide a termination resistance to the termination circuit in response to a termination resistor control signal;
a bias unit including a first transistor connected to a positive transmission pin of a differential pair of the HDMI transmitter and a second transistor connected to a negative transmission pin of the differential pair of the HDMI transmitter, and configured to generate the bias voltage based on a first voltage received through the positive transmission pin of the differential pair of the HDMI transmitter and a second voltage received through the negative transmission pin of the differential pair of the HDMI transmitter; and
a control unit configured to receive the bias voltage and generate the termination resistor control signal based on the bias voltage,
wherein the termination resistor unit is connected to the positive transmission pin of the differential pair of the HDMI transmitter and the negative transmission pin of the differential pair of the HDMI transmitter.

18. The termination circuit of claim 17, wherein the control unit includes a switch configured to receive ON/OFF control signal, and
wherein the terminal resistor control signal is generated based on the bias voltage and the ON/OFF control signal.

19. The termination circuit of claim 18, wherein a drain of the first transistor and a gate of the second transistor are connected to the positive transmission pin of a differential pair of the HDMI transmitter, and
wherein a drain of the second transistor and a gate of the first transistor are connected to the negative transmission pin of the differential pair of the HDMI transmitter.

20. The termination circuit of claim 19, the termination resistor unit further comprises:
a second connection transistor formed on a semiconductor well region biased by the bias voltage,
wherein a gate of the first connection transistor and a gate of the second connection transistor are connected to each other; and
wherein the first connection transistor and the second connection transistor conditionally provide the termination resistance to the termination circuit in response to the termination resistor control signal.

21. A termination circuit for a HDMI (High Definition Multimedia Interface) transmitter, comprising:
a termination resistor unit including a first connection transistor formed on a semiconductor well region biased by a bias voltage, and configured to conditionally provide a termination resistance to the termination circuit; and
a bias unit configured to generate the bias voltage based on a first voltage received through a positive transmission pin of a differential pair of the HDMI transmitter and a second voltage received through a negative transmission pin of the differential pair of the HDMI transmitter,
wherein the bias voltage is substantially equal to a higher voltage between the first voltage and the second voltage; and
wherein the termination resistor unit and the bias unit are connected in parallel between the positive transmission pin of the differential pair of the HDMI transmitter and the negative transmission pin of the differential pair of the HDMI transmitter.

22. The termination circuit of claim 21, wherein the termination resistor unit and the bias unit only use the first voltage and the second voltage as power sources.

23. The termination circuit of claim 21, further comprising:
a first protection resistor connected to the positive transmission pin of the differential pair of the HDMI transmitter and the bias unit; and
a second protection resistor connected to the negative transmission pin of the differential pair of the HDMI transmitter and the bias unit.

24. The termination circuit of claim 23, the bias unit comprising:
a first transistor; and
a second transistor,
wherein a drain of the first transistor and a gate of the second transistor are connected to the first protection resistor; and
wherein a drain of the second transistor and a gate of the first transistor are connected to the second protection resistor.

25. The termination circuit of claim 21, wherein the termination resistor unit receives a termination resistor control signal and conditionally provide the termination resistance to the termination circuit in response to the termination resistor control signal,
wherein the termination resistor control signal is generated based on the first voltage as power source.

26. The termination circuit of claim 25, further comprising:
a control unit configured to generate the termination resistor control signal; and
wherein the termination resistor unit, the bias unit, and the control unit are connected in parallel between the positive transmission pin of the differential pair of the HDMI transmitter and the negative transmission pin of the differential pair of the HDMI transmitter.

27. The termination circuit of claim 21, wherein the termination resistor unit receives a termination resistor control signal and conditionally provide the termination resistance to the termination circuit in response to the termination resistor control signal,
wherein the termination resistor control signal is generated based on the bias voltage.

28. The termination circuit of claim 27, further comprising:
a control unit configured to receive ON/OFF control signal and generate the termination resistor control signal based on the bias voltage and the ON/OFF control signal; and wherein the termination resistor control signal has a voltage equal to or higher than 1.5V when the ON/OFF control signal is at a logic high level.

* * * * *